(12) United States Patent
Matsuzawa et al.

(10) Patent No.: US 10,254,629 B2
(45) Date of Patent: Apr. 9, 2019

(54) ELECTRONIC DEVICE

(71) Applicant: CANON KABUSHIKI KAISHA, Tokyo (JP)

(72) Inventors: Shuichi Matsuzawa, Chofu (JP); Hiroki Ota, Tokyo (JP); Koji Ishikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/944,853

(22) Filed: Apr. 4, 2018

(65) Prior Publication Data
US 2018/0224717 A1  Aug. 9, 2018

Related U.S. Application Data

(63) Continuation of application No. PCT/JP2016/004758, filed on Oct. 28, 2016.

(30) Foreign Application Priority Data

| Oct. 30, 2015 | (JP) | 2015-213882 |
| Jul. 29, 2016 | (JP) | 2016-150461 |
| Oct. 28, 2016 | (JP) | 2016-211645 |

(51) Int. Cl.
    *G03B 17/02* (2006.01)
    *G03B 17/56* (2006.01)
    (Continued)

(52) U.S. Cl.
    CPC .............. *G03B 17/02* (2013.01); *G03B 17/56* (2013.01); *H05K 5/0021* (2013.01);
    (Continued)

(58) Field of Classification Search
    USPC ......................................................... 396/541
    See application file for complete search history.

(56) References Cited

U.S. PATENT DOCUMENTS

| 8,531,592 B2* | 9/2013 | Teetzel ................... A42B 3/042 |
| | | 345/7 |
| 9,134,590 B2 | 9/2015 | Iikawa et al. |

(Continued)

FOREIGN PATENT DOCUMENTS

| JP | S61-59972 A | 3/1986 |
| JP | H08-172561 A | 7/1996 |

(Continued)

OTHER PUBLICATIONS

International Search Report issued in parent International Application No. PCT/JP2016/004758 dated Jan. 31, 2017.

(Continued)

*Primary Examiner* — Clayton E Laballe
*Assistant Examiner* — Warren K Fenwick
(74) *Attorney, Agent, or Firm* — Venable LLP

(57) ABSTRACT

The electronic device can be used with an accessory module that is a second device attached to a device main body that is a first device. The accessory module includes a locking member that is held so as to be able to be turned. The locking member includes a ring-shaped portion that has a plurality of claw portions and an operation portion for performing a turning operation. The device main body 1 includes a plurality of claw portions corresponding to the plurality of claw portions of the locking member. The claw portions and the claw portions engage with each other in a state in which the accessory module is attached to the device main body by the turning operation of the operation portion, and the claw portions and the claw portions are not engaged in a state in which the accessory module can be removed from the device main body.

29 Claims, 32 Drawing Sheets

(51) Int. Cl.
    *H05K 5/00*        (2006.01)
    *H05K 5/02*        (2006.01)
    *H04N 5/225*      (2006.01)
    *G03B 17/14*      (2006.01)
    *G03B 13/02*      (2006.01)

(52) U.S. Cl.
    CPC ........... *H05K 5/0221* (2013.01); *G03B 13/02* (2013.01); *G03B 17/14* (2013.01); *G03B 2217/002* (2013.01); *H04N 5/2251* (2013.01)

(56) References Cited

U.S. PATENT DOCUMENTS

| | | | |
|---|---|---|---|
| 10,101,639 B2 * | 10/2018 | Pizzo | ................... G03B 17/14 |
| 2013/0265664 A1 | 10/2013 | Iinuma et al. | |
| 2014/0049911 A1 | 2/2014 | Corbin et al. | |

FOREIGN PATENT DOCUMENTS

| | | |
|---|---|---|
| JP | H10-145535 A | 5/1998 |
| JP | 2006-251058 A | 9/2006 |
| JP | 2008-245144 A | 10/2008 |
| JP | 2010-145616 A | 7/2010 |
| JP | 2013003391 A | 1/2013 |
| JP | 2013-218149 A | 10/2013 |
| JP | 2014-508998 A | 4/2014 |

OTHER PUBLICATIONS

Japanese Office Action issued in corresponding Japanese Application No. 2018074370 dated Jan. 8, 2019.

\* cited by examiner

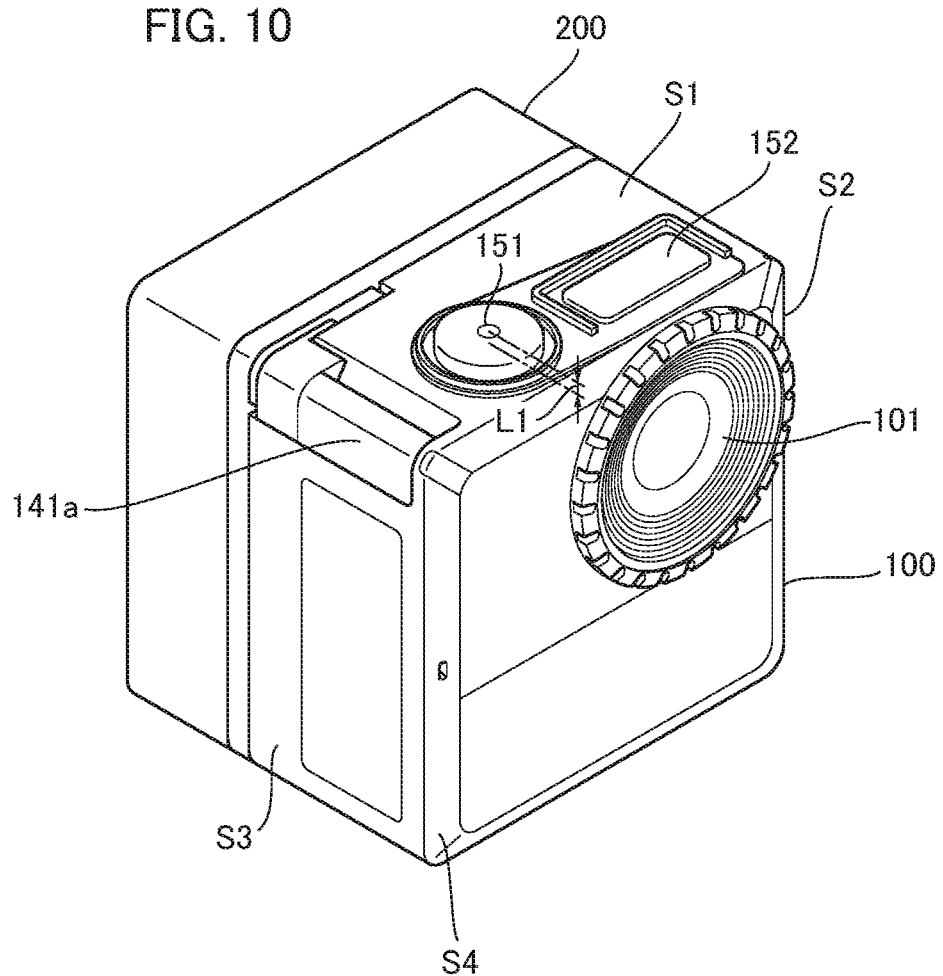

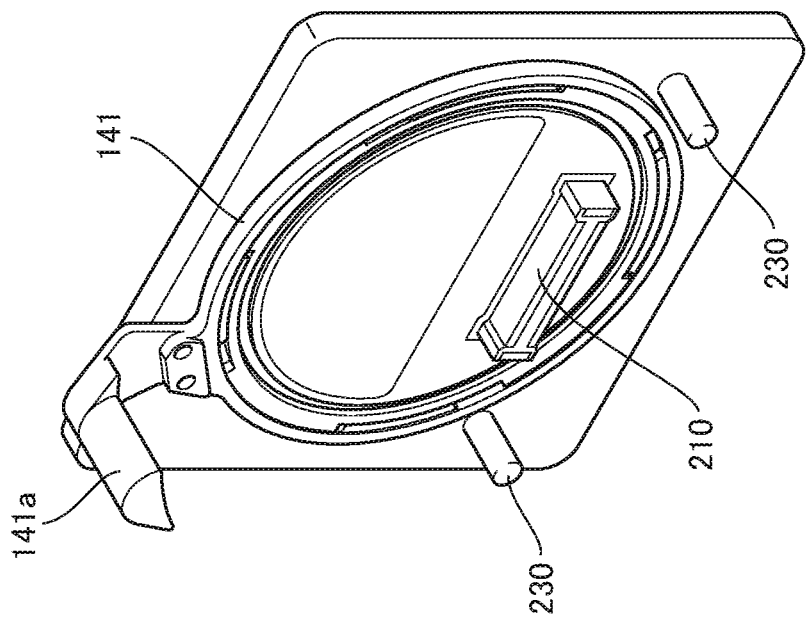
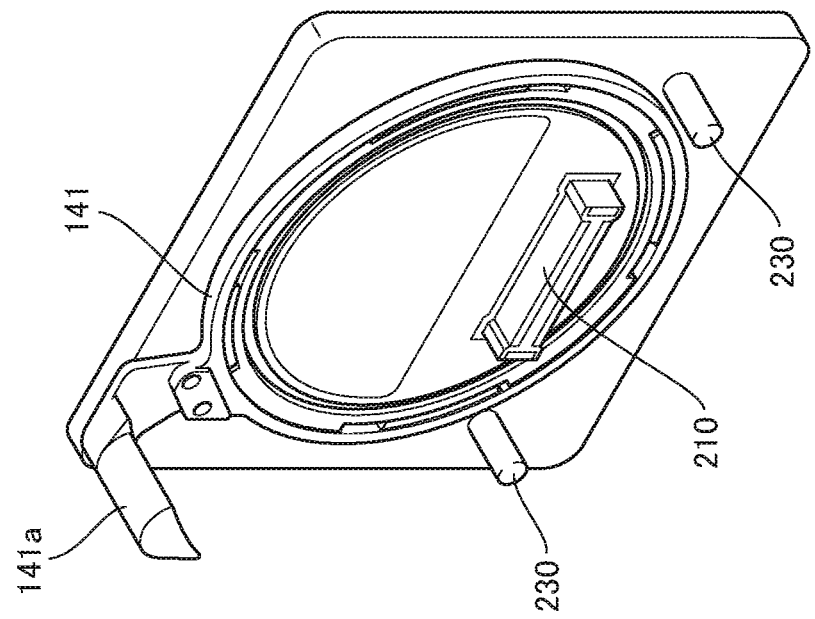

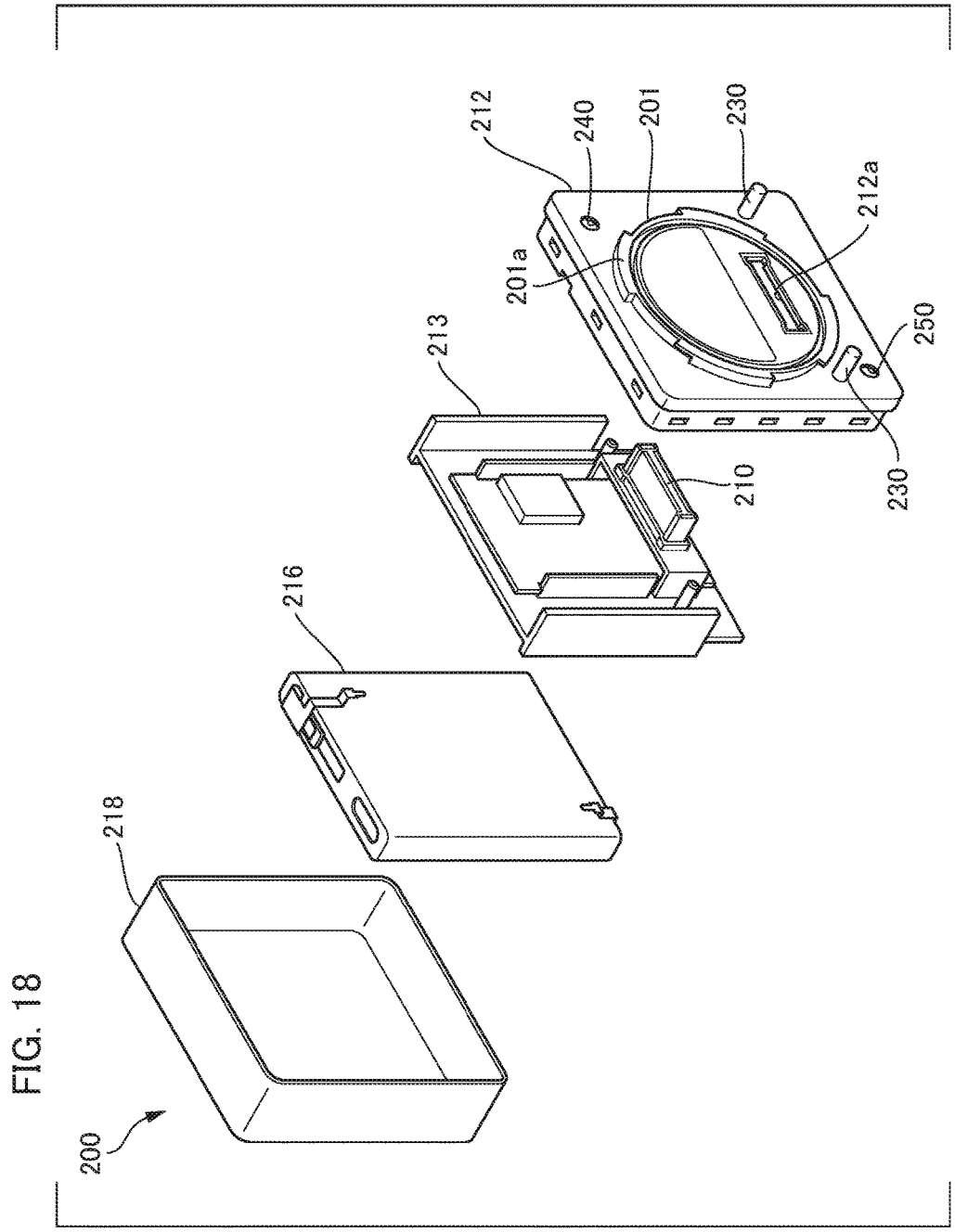

A-A SECTIONAL VIEW

B-B SECTIONAL VIEW

ELECTRONIC DEVICE

CROSS-REFERENCE TO RELATED APPLICATIONS

This application is a Continuation of International Patent Application No. PCT/JP2016/004758, filed Oct. 28, 2016, which claims the benefit of Japanese Patent Application No. 2015-213882, filed Oct. 30, 2015, Japanese Patent Application No. 2016-150461, filed Jul. 29, 2016 and Japanese Patent Application No. 2016-211645, filed Oct. 28, 2016. The contents of these applications are hereby incorporated by reference herein in their entirety.

BACKGROUND OF THE INVENTION

Field of the Invention

The present invention relates to an attachment and detachment mechanism for a module in an electronic device that can be used with the module attached thereto.

Background Art

In an imaging device such as a digital camera, an image signal, image information, and the like output from an imaging element are recorded as data files. An imaging lens causes an optical image to be formed on the imaging element, and compression processing in a file format of Joint Photographic Experts Group (JPEG) or the like is performed on image data obtained by photoelectric conversion in the imaging element, for example.

An electronic device including an imaging device can realize an electronic device which is a so-called modular assembly electronic device that has desired functions, by assembling modules such as blocks that are caused to have predetermined functions, by collecting together a plurality of parts. Patent Literature 1 discloses a technology that enables improvement in usability and securing fixing of a module at the same time without using a fastener by using an electromagnetic attachment and detachment mechanism for attaching and detaching the module.

In addition, Patent Literature 2 discloses a technology that enables attachment and detachment of a replacement lens to and from a main body of an imaging device. A lens mount for a user to attach and detach a replacement lens that has a bayonet claw portion (112) to and from the main body of the imaging device is provided. The user rotates a movable mount portion about an optical axis from a state in which the bayonet claw portion and a claw portion (241) of the movable mount portion do not overlap on an optical axis projection. In this manner, the movable mount portion moves toward a first fixation portion (21) in an optical axis direction when a female screw portion formed at a fixed mount portion and a male screw portion formed at the movable mount portion are screwed together, and the claw portion and the bayonet claw portion come into contact with each other.

CITATION LIST

Patent Literature

Patent Literature 1: Japanese Patent Laid-Open (Translation of PCT Application) No. 2014-508998
Patent Literature 2: Japanese Patent Laid-Open No. 2013-218149

According to the configuration disclosed in Patent Literature 1, the weight of each accessory module including the weight of an electromagnet is high. Therefore, there is a likelihood that a user may inadvertently drop the electronic device, and there is a concern that any of the accessory modules may fall off the device main body at the time of dropping since no physical holder is provided. In addition, in a case of a modular assembly electronic device, heat sources may become concentrated depending on how the modules are assembled, and there may be a problem of increase in temperature. It is necessary to shorten an operation time of this device in order to curb an increase in temperature, otherwise there is a likelihood that the functions and performance of the device may become restricted.

In addition, it is difficult for an increase in size of the device to be avoided in the configuration disclosed in Patent Literature 2 due to screw movement of the movable mount portion and attachment of an operation member of the movable mount portion although it is possible to reliably fix the accessory module.

An object of the present invention is to provide a small-sized electronic device that can be used with the second device reliably attached to the first device.

SUMMARY OF THE INVENTION

According to an embodiment of the present invention, there is provided an electronic device that can be used with a first device attached to a second device, the electronic device including: a locking member that is provided in the first device and fixes the first device to the second device when the second device is attached to the first device, in which the locking member has a first engagement portion and an operation portion, the second device has a second engagement portion that engages with the first engagement portion, the operation portion is able to be operated turned between a licked position and a locking released position, the first engagement portion and the second engagement portion engage with each other by the operation portion being operated to be turned into the locked position when the second device is attached to the first device, the engagement between the first engagement portion and the second engagement portion is released by the operation portion being operated to be turned into the locking released position when the second device is attached to the first device, and an amount of projection of the operation portion from a case body of the first device or the second device when the operation portion is located at the locking released position is greater than an amount of projection of the operation portion from the case body of the first device or the second device when the operation portion is located at the locked position.

According to the present invention, it is possible to provide a small electronic device that can be used with a second device reliably attached to a first device.

Further features of the present invention will become apparent from the following description of exemplary embodiments with reference to the attached drawings.

BRIEF DESCRIPTION OF THE DRAWINGS

FIG. 10 is an exterior perspective view of an electronic device according to a fourth embodiment of the present invention.

FIGS. 17A and 17B are perspective views for explaining a relationship between a locking member and a module according to the fourth embodiment.

FIG. 18 is an exploded perspective view of the module according to the fourth embodiment.

DESCRIPTION OF THE EMBODIMENTS

Figure 1A:
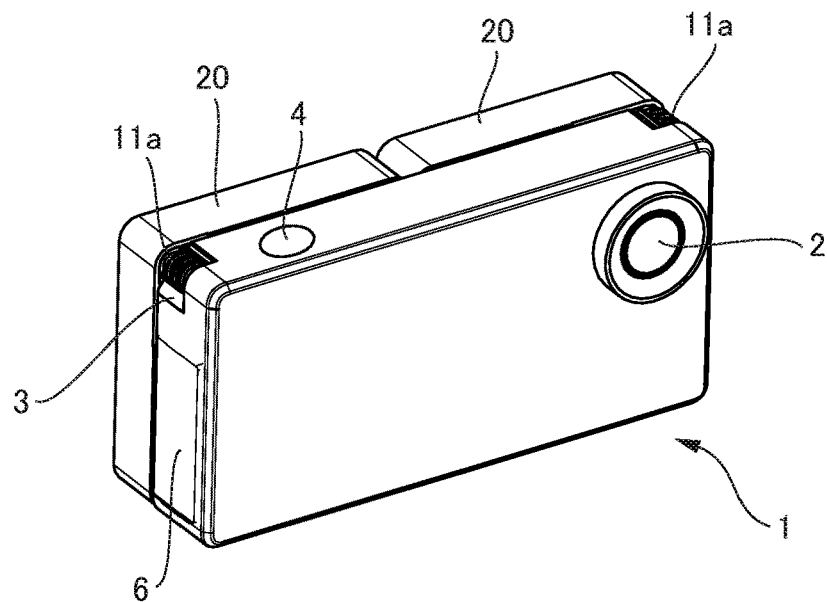
FIGS. 1A and 1B are exterior perspective views of a device main body of an electronic device according to a first embodiment of the present invention.
Figure 1B:
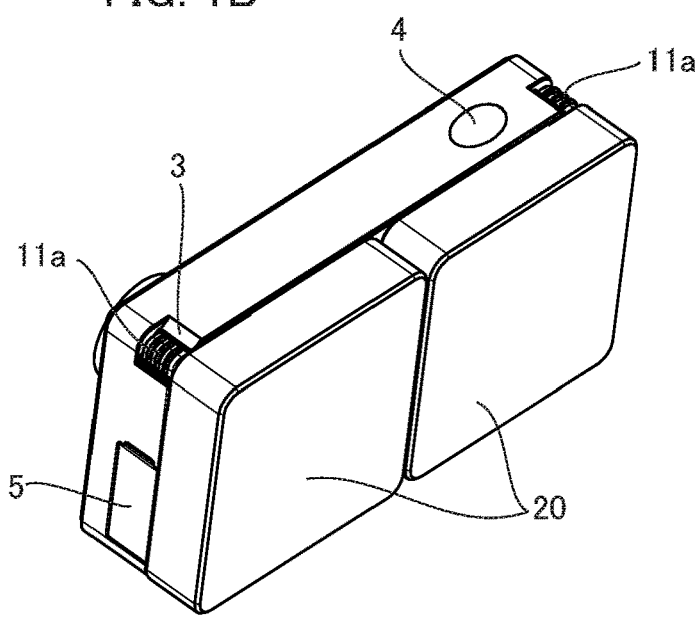

Hereinafter, the respective embodiments of the present invention will be described in detail with reference to the accompanying drawings. An electronic device according to the embodiments is a modular assembly electronic device that can be used in such a manner that a second device is attached to a first device. The following description will be given on the assumption that the first device is a main body of the electronic device and the second device is a module device.

First Embodiment

Referring to FIGS. 1 to 6, a first embodiment of the present invention will be described. FIGS. 1A and 1B are explanatory diagrams of an electronic device according to the embodiment. FIG. 1A is a perspective view in which the electronic device is viewed from the front side, and FIG. 1B is a perspective view in which the electronic device is viewed from the back side. Hereinafter, positional relationships between respective portions will be described by defining a subject side as the front side.

An imaging portion 2 is fixed to a main body of the electronic device (hereinafter, referred to as a device main body) 1. The imaging portion 2 is included in an imaging optical system that forms an image of light from a subject. An imaging element is mounted on the back side of the imaging portion 2 inside the device main body 1. The imaging element is a charge coupled device (CCD) image sensor, a complementary metal oxide semiconductor (CMOS) image sensor, or the like that performs photoelectric conversion on the optical image to generate image data. A main substrate, a complementary substrate, or the like on which electronic parts such as a processing circuit to convert the image data generated after imaging into digital information are mounted is disposed in the device main body 1.

A release button 4 is provided on an upper surface portion of the device main body 1. A two-stage pressing operation can be performed on the release button 4. If a user performs a half-pressing operation on the release button 4, an imaging preparation operation (a light measurement operation, a distance measurement operation, and the like) is started. Further, if the user performs a full-pressing operation on the release button 4, an imaging operation of the subject is started, and the captured image data is recorded in a recording medium. The recording medium can be attached to an accommodation chamber 5.

A side surface portion of the device main body 1 is provided with an input and output socket (not illustrated) for a power source and signals and is covered with a protection socket cover 6. The user can open the socket cover 6 to insert various cables into the input and output socket and pull the cables out of the input and output socket. Two modules 20 are attached to the back surface portion of the device main body 1. The user can detach an accessory module 20 by performing an operation of turning the locking member 11. The locking member 11 can be operated between a locked position and a lock released position.

The accessory module (hereinafter, simply referred to as a module) 20 includes the following modules, for example.

- A power source module that accommodates a main battery (a primary battery or a secondary battery) that is a power source
- An external I/O (input and output) module that has a connector that communicates with an external device
- A NFC (near field communication) module that performs near-field wireless communication
- A communication module that transmits and receives data in wireless communication with an external device
- A speaker module that outputs music and operation sounds
- A microphone module that inputs sound
- A recording module with a large capacity for saving data that exceeds the capacity of the recording medium
- A display module provided with a liquid crystal display (LCD), or the like
- A cooling portion that accumulates heat generated by the device main body 1 or the modules 20

The user can select a module in accordance with a required function and can use a desired module by attaching the module to the back surface portion of the device main body 1.

Figure 2A:
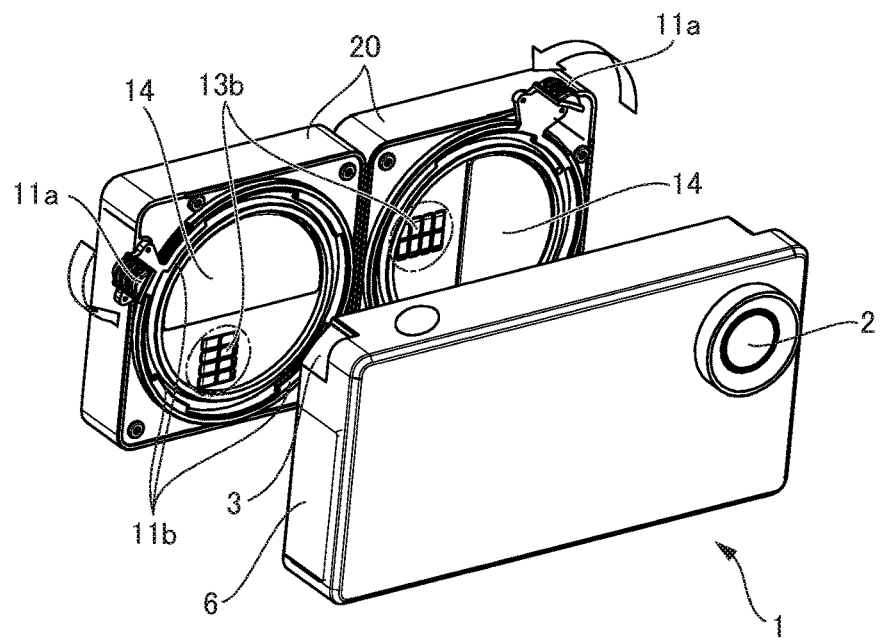
FIGS. 2A and 2B are exterior perspective views illustrating a module removed from the device main body according to the first embodiment.
Figure 2B:
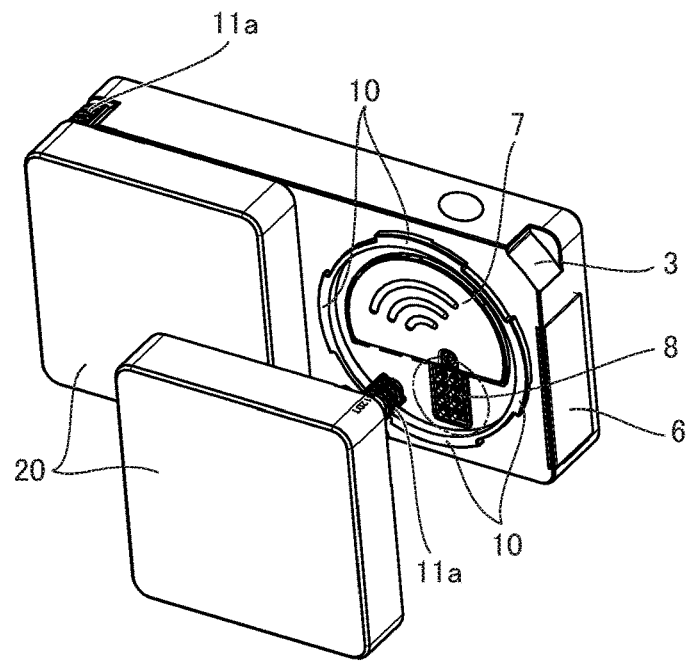

Referring to FIGS. 2A and 2B, removal of the module 20 from the device main body 1 will be described. FIG. 2A is a perspective view of a case in which a removed state of the modules 20 from the device main body 1 is viewed from the front side. FIG. 2B is a perspective view of a case in which the removed state of one module 20 is viewed from the back side.

The user turns an operation portion 11a of the locking member 11 located at an edge (corner edge) of the electronic device by a predetermined angle in a predetermined direction for removing the module 20 from the device main body 1. The predetermined direction is a counterclockwise direction when viewed from the front as represented by the arrow in FIG. 2A. The operation portion 11a is located in a notch portion 3 formed at the edge of the electronic device and is exposed to the outside.

A plurality of claw portions 11b are provided as engagement portions inside a ring-shaped portion 11d (see FIG. 3B) of the locking member 11. In the embodiment, the claw portions 11b are located at four positions in the ring-shaped portion 11d. Four claw portions 10 are provided in the device main body 1 as engagement portions that respectively correspond to the plurality of claw portions 11b. It is possible to release the attachment of the module 20 by the claw portions 11b and the claw portions 10, which form the engagement portions, moving from a locked position at which the claw portions 11b and the claw portions 10 overlap in projection when viewed from a front-back direction to a lock released position at which the claw portions 11b and the claw portions 10 do not overlap. That is, when the locking member 11 is located at the locked position, the plurality of claw portions 11b and the plurality of claw portions 10 are brought into a mutually engaged state. When the operation portion 11a is located at the lock released position, the plurality of claw portion 11b and the plurality of claw portions 10 are brought into a state in which the engagement is released.

Figure 5A:
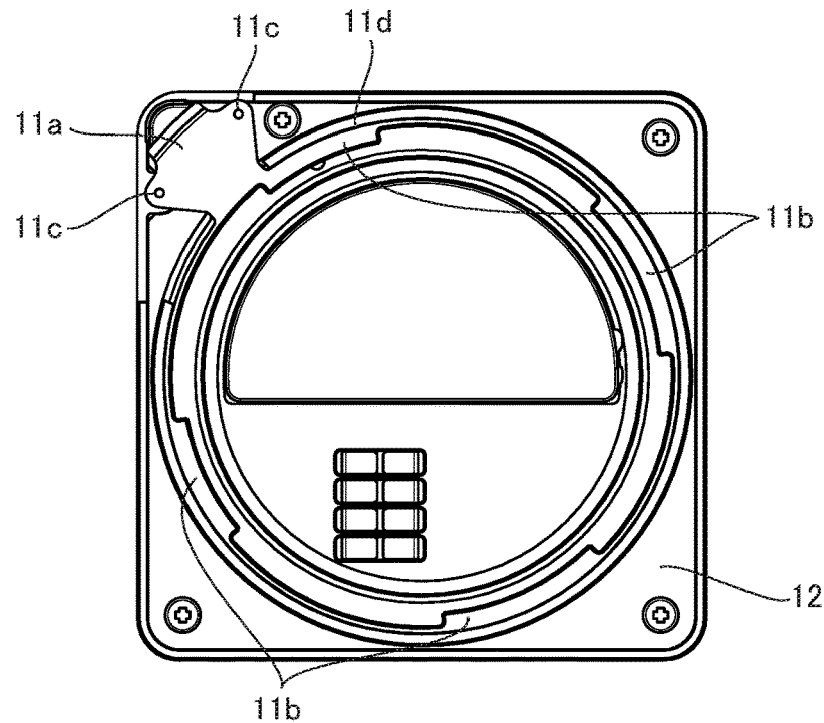
FIGS. 5A and 5B are diagrams for explaining state transition of the electronic device according to the first embodiment.

When the locking member 11 is located at the locked position, the operation portion 11a does not project from a case body of the module 20 (see FIG. 5A). In the embodiment, when the locking member 11 is located at the locked position, the operation portion 11a is accommodated in the notch portion 3 formed in the case body of the device main body 1 and also does not project from the case body of the device main body 1.

Figure 5B:
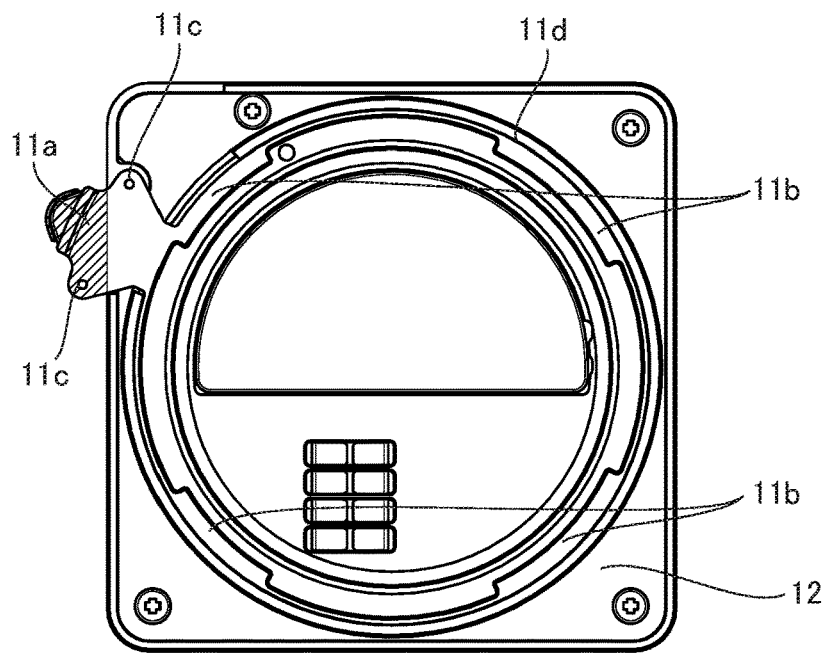

When the locking member 11 is located at the lock released position, the operation portion 11a projects from the case body of the module 20 (see FIG. 5B). In the embodiment, when the locking member 11 is located at the lock released position, the operation portion 11a is not accommodated in the notch portion 3 formed in the case body of the device main body 1 and also projects from the case body of the device main body 1.

Electrical communication connection terminals 13b (eight positions in the drawing) are exposed from the module 20 on the side of the device main body 1. The electrical communication connection terminals 13b are arranged inside the ring-shaped portion 11d of the locking member 11, and when the module 20 is attached to the device main body 1, electrical connection with electrical communication connection pins 8 (eight positions in the drawing) provided in the device main body 1 is established.

A heat transfer member 14 is arranged to be adjacent to the electrical communication connection terminals 13b. The heat transfer member 14 is press-fitted to a heat releasing panel 7 of the device main body 1 in a state in which the module 20 is attached to the device main body 1. The heat releasing panel 7 is a heat releasing member that releases heat generated by a heat source inside the device main body 1. The heat from the heat releasing panel 7 is delivered to the heat transfer member 14 between the device main body 1 and the module 20. The heat transfer member 14 generally includes a block formed of a material with a high heat transfer rate, such as copper or aluminum, and a plate member made of an extruded material. In the embodiment, a heat transfer rubber member made of an elastic body that freely stretches is accommodated inside the heat transfer member 14. The heat transfer rubber member has tackiness and adhesiveness, absorbs any inclination of a contact surface between the device main body 1 and the module 20, and exhibits a good heat releasing effect. The material of the heat transfer rubber member may be silicone rubber or the like.

Figure 3A:
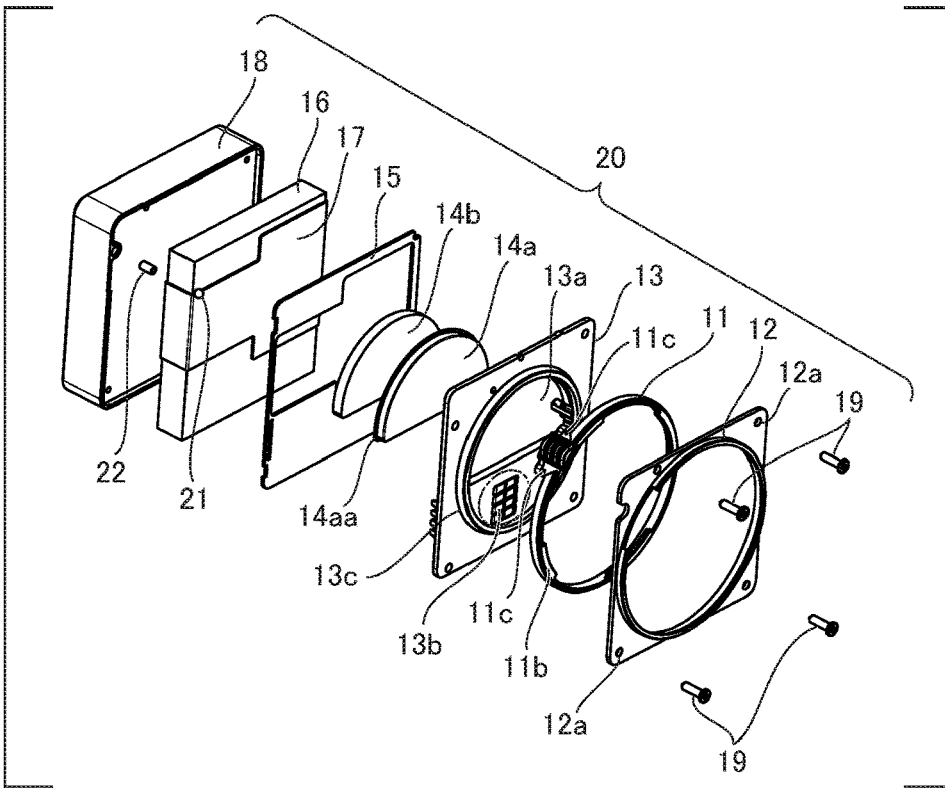
FIGS. 3A and 3B are exploded perspective views of the module according to the first embodiment
Figure 3B:
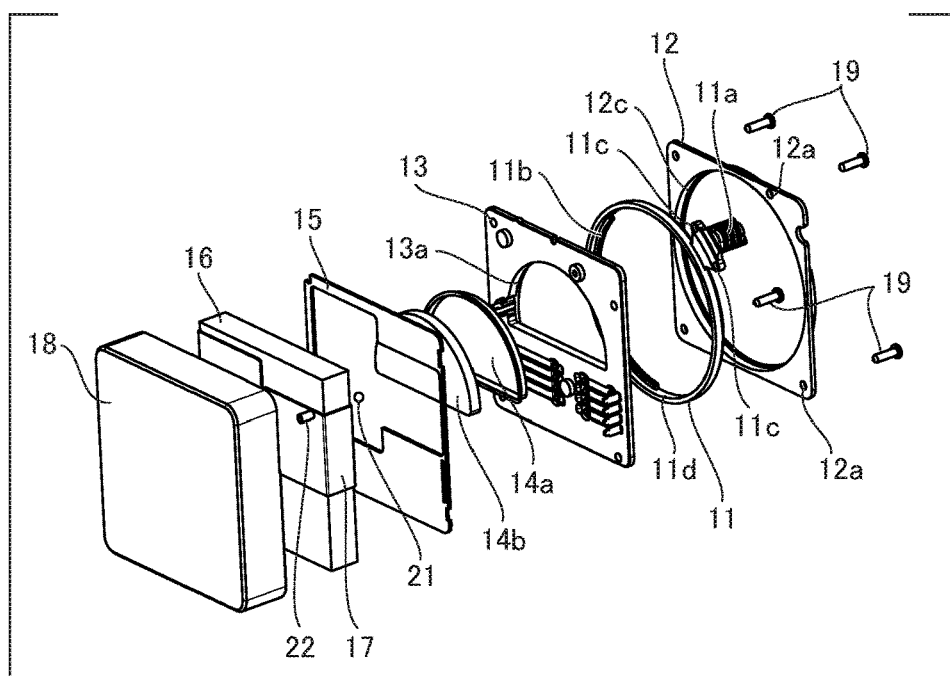

FIG. 3A is an exploded perspective view in which the module 20 is viewed from the front side. FIG. 3B is an exploded perspective view in the state in which it is viewed from the back side. In the embodiment, a power source module that accommodates a main battery that serves as a power source will be exemplified, and the configuration thereof will be described in detail.

The power source module 20 supplies a voltage and a current necessary for the device main body 1 and the respective parts of the modules. As a battery 16 for the power source module 20, a lithium ion battery, a fuel battery, or the like is used and is accommodated in the module cover 18. A heat transfer panel 17 is wound around the periphery of the battery 16 and is thermally connected to the heat releasing panel 7 (see FIG. 2B) of the device main body 1 via the heat transfer member 14. Therefore, it is possible to curb local increase in temperature inside the device main body 1 by allowing the heat generated inside the device main body 1 to further diffuse from the periphery of the battery 16 to the periphery of an exterior of the module.

The semicircular heat transfer member 14 includes a heat transfer panel member 14a and a heat transfer rubber member 14b. The heat transfer rubber member 14b is accommodated in the heat transfer panel member 14a and is fixed thereto with double-sided tape or the like. The heat transfer rubber member 14b made of an elastic body that freely stretches can hold a state of being charged by both the heat releasing panel 7 of the device main body 1 and the heat transfer panel 17 of the module 20 when the module 20 is attached to the device main body 1. Use of the heat transfer rubber member 14b leads to a good heat transfer effect. However, in a case in which the heat transfer rubber member 14b is exposed to exterior portions, there are concerns such as discoloration due to aging and deterioration of the heat transfer effect due to adhesion of dust due to the stickiness. Thus, a configuration in which the heat transfer rubber member 14b is protected by the heat transfer panel member 14a is employed in the embodiment. A flange shape 14aa is provided over the entire periphery of the heat transfer panel member 14a. In order to prevent the heat transfer member 14 from falling out of the module 20, a contact holder 13 retains the heat transfer panel member 14a.

A dust proofing sheet 15 is interposed between and fixed by the contact holder 13 and the module cover 18 in a state in which only a connection route of the heat transfer member 14 and the heat transfer panel 17 is opened. In this manner, dustproof properties and drip-proof properties of the module 20 are enhanced. The contact holder 13 has an opening 13a into which the heat transfer member 14 is inserted. The semicircular opening 13a functions to cause the heat transfer member 14 to be exposed outside of the module. The electrical communication connection terminals 13b (eight positions in the drawing) of the contact holder 13 are exposed outside of the module and are brought into contact with the connection pins 8 (see FIG. 2B) of the device main body 1 when attached to the device main body 1. The contact holder 13 includes resin parts, and the plurality of electrical communication connection terminals 13b are integrated by insert molding. The electrical communication connection terminals 13b are soldered and connected to the battery 16 or the like with a cable or the like (not illustrated).

The operation portion 11a and the ring-shaped portion 11d are integrally formed in the locking member 11. The locking member 11 includes the claw portions 11b at four positions in an inner periphery of the ring-shaped portion 11d. The ring-shaped portion 11d of the locking member 11 is interposed between a sliding surface portion 13c of the contact holder 13 and a flange portion 12c of the fixed mount portion 12 and fits thereinto in a slidable state. A volatile sliding grease (low friction) or the like is applied to a portion along which the ring-shaped portion 11d slides in order to improve durability and reduce roughness during the rotation. Concave portions 11c are respectively formed in the front-back direction at two portions at which the operation portion 11a projects in a circumferential direction. The module cover 18 includes a metal spherical body 21 and an elastic member 22 as a biasing member therefor. The metal spherical body 21 is configured to be engaged with the concave portions 11c and hold the position of the operation portion 11a in the locked position or the lock released position.

A plurality of through-holes 12a are formed at edges of the fixed mount portion 12. A plurality of screws 19 are inserted into the through-holes 12a and are fastened to tap holes formed in the module cover 18, and the assembly of the module is thus completed.

Figure 4A:
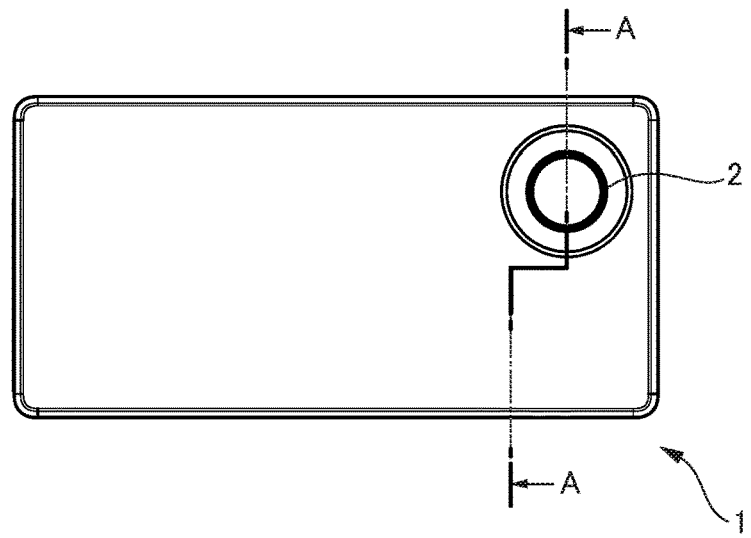
FIG. 4A is a front view of the electronic device according to the first embodiment and FIG. 4B is a sectional view taken along the A-A portion.
Figure 4B:
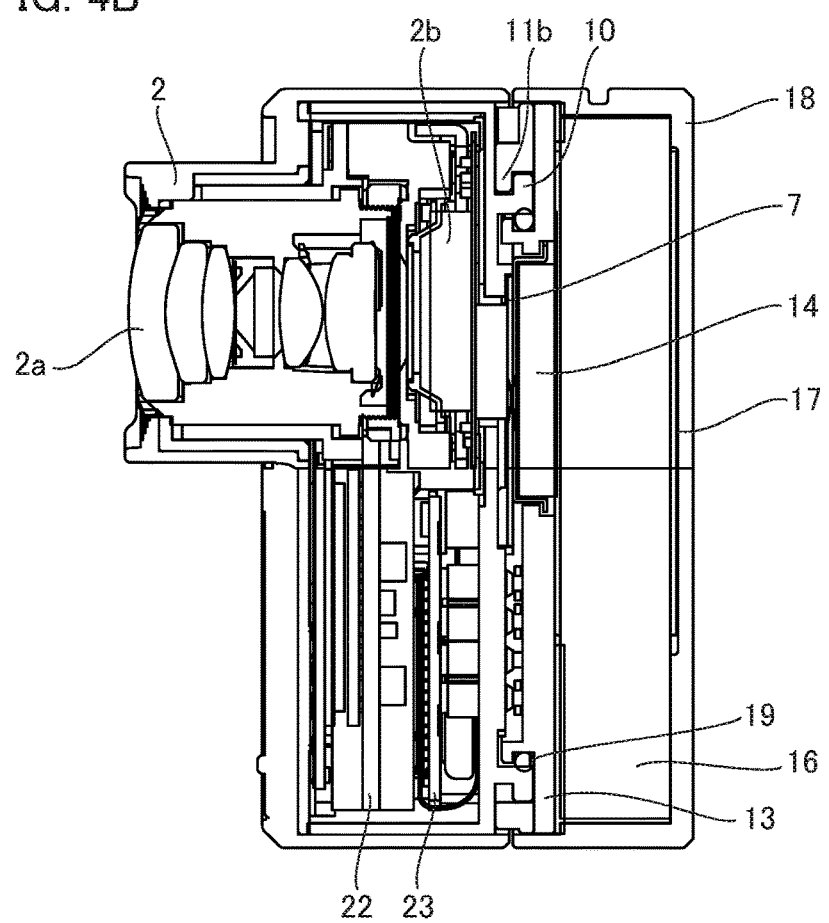

FIG. 4A is a front view of the device main body 1. FIG. 4B is a sectional view taken along the A-A portion in FIG. 4A. The respective drawings illustrate a state in which the module 20 is attached to the device main body 1. A plurality of lenses 2a are arranged inside the imaging portion 2 fixed to the device main body 1. An imaging element 2b is mounted on the back side of the lens group and performs photoelectric conversion on an optical image to generate image data. A main substrate 22 and an auxiliary substrate 23 are arranged on the side of the lens group and the imaging element 2b, and a processing circuit or the like to convert image data acquired by the imaging element 2b into digital information is mounted. On the main substrate 22, an imaging portion, an image processing portion, a power supply switching circuit, a DC/DC converter, a system control portion, a serial interface (I/F) portion, a serial connection terminal, and the like are mounted. On the auxiliary substrate 23, a recording medium slot including a card I/F portion, an external power source input terminal, and the like are mounted.

The battery 16 occupies the largest part inside the module 20. Thermal connection between the device main body 1 and the heat releasing panel 7 is established from the heat transfer panel 17 wound around the battery 16 via the heat transfer member 14. Since the heat generated inside the device main body 1 is further diffused to the periphery of the exterior portion of the module from the periphery of the battery 16, it is possible to curb local increase in temperature inside the device main body 1.

The plurality of claw portions 11b provided in the locking member 11 and the plurality of claw portions 10 provided in the device main body 1 overlap in projection when viewed from the front-back direction, and the module 20 is held in an attached state to the device main body 1. Since the corresponding claw portions 11b and the claw portions 10 slidably fit into each other, it is possible to attach the module 20 to the device main body 1 in a state in which no backlash occurs. An O-ring 19 is arranged between standing walls of the claw portions 10 provided in the device main body 1 and the contact holder 13. In this manner, the dust proofing properties and the drip proofing properties between the device main body 1 and the module are enhanced.

Referring to FIGS. 5A and 5B, the state of the module 20 will be described. FIG. 5A is a diagram illustrating a locked state in which the plurality of claw portions 11b and the plurality of claw portions 10 provided in the device main body 1 are engaged with each other and the module 20 is attached to the device main body 1. FIG. 5B is a diagram illustrating a lock released state in which the engagement between the plurality of claw portions 11b and the plurality of claw portions 10 provided in the device main body 1 is released and the module 20 can be removed. Both diagrams illustrate a state in which the module 20 is viewed from the front face.

The user turns the operation portion 11a at a predetermined angle in the counterclockwise direction in the paper plane of FIGS. 5A and 5B for removing the module 20 from the device main body 1. The claw portions 11b of the locking member 11 and the claw portions 10 of the device main body 1 are turned from the locked position to the lock released position and are brought into a state in which both the claw portions 11b and the claw portions 10 do not overlap when viewed in the front-back direction. Therefore, it is possible to release the attachment of the module 20. As illustrated in FIG. 5B, the operation portion 11a projects in a state in which the operation portion 11a is exposed from a range of a projection area of the device main body 1 in the front-back direction in the lock released position (see the hatched portion). In addition, the area in which the operation portion 11a and the case body of the module 20 overlap in the projection increases, and the operation portion 11a is accommodated in the case body of the module 20 in the locked position as illustrated in FIG. 5A. As illustrated in FIG. 5A, the operation portion 11a does not project from the case body of the module 20 when the locking member 11 is located at the locked position. In the embodiment, the operation portion 11a also does not project from the case body of the device main body 1 when the locking member 11 is located at the locked position. As illustrated in FIG. 5B, the operation portion 11a projects from the case body of the module 20 when the locking member 11 is located at the lock released position. In the embodiment, the operation portion 11a also projects from the case body of the device main body 1 when the locking member 11 is located at the lock released position. The projection amount by which the operation portion 11a projects from the case body of the module 20 or the device main body 1 in the lock released position is greater than the projection amount by which the operation portion 11a projects from the case body of the module 20 or the device main body 1 in the locked position.

The concave portions 11c formed in the operation portion 11a and the metal spherical body 21 accommodated in the module 20 are engaged, and the metal spherical body 21 is biased by the elastic member 22 (see FIGS. 3A and 3B). Therefore, the operation portion 11a is configured to be held in the locked position and the lock released position.

Figure 6A:
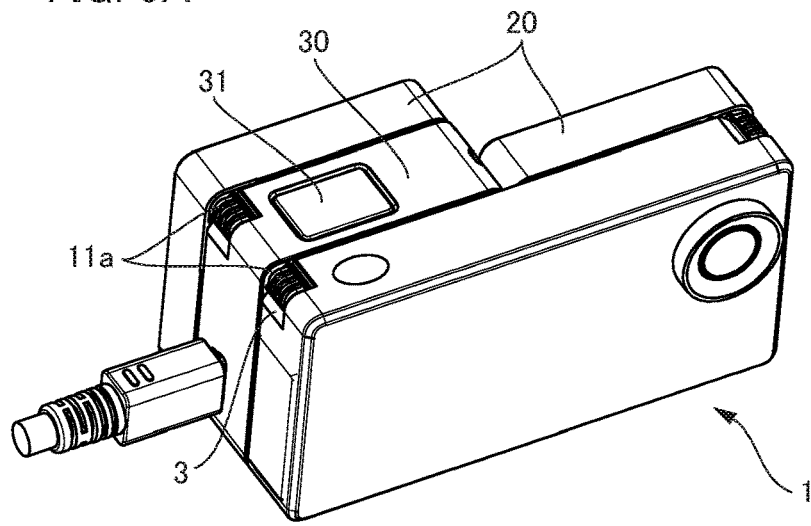
FIGS. 6A and 6B are exterior perspective views illustrating an example of use of the electronic device according to the first embodiment.
Figure 6B:
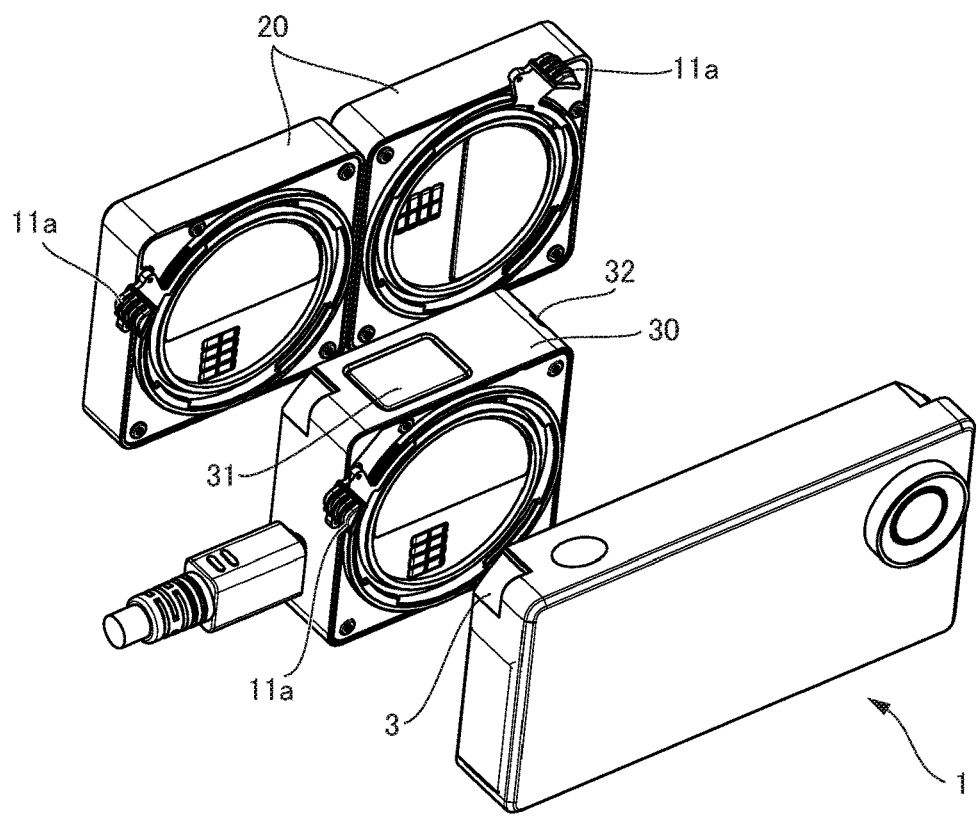

FIG. 6A is a perspective view of a case in which the device main body 1 with a plurality of modules attached thereto is viewed from the front side. FIG. 6B is a perspective view of a case in which a state of the plurality of modules 20 removed from the device main body 1 is viewed from the front side. FIG. 6A illustrates a state in which another module 30 is attached between the device main body 1 and the power source module 20. A synchronization module 30 that is used for image capturing will be described as an example.

The synchronization module 30 performs control to prevent consistency from being lost due to an occurrence of time lag or the like between a transmission-side device and a reception-side device in a case in which a plurality of imaging devices perform image capturing simultaneously. A microcomputer and wired and wireless interface portions are mounted on the synchronization module 30. The synchronization module 30 corrects frames by external synchronization based on generator lock (GenLock), shares movie time codes in real time, or performs synchronous control of a time axis by using a built-in clock.

The synchronization module 30 has an operation button 31 on an upper surface portion. If the user presses the operation button 31, the imaging device on which the synchronization module 30 is mounted serves as a master device that manages control and operations of other imaging devices. The other imaging devices serves as slave devices that operate under one-way control of the master device, and roles are assigned to the other imaging devices. An LED 32 is a lighting up portion for identification. Since the LED 32 is turned on only for the synchronization module that has been recognized as the master device, the user can easily ascertain that the synchronization module is the master device. The synchronization module 30 includes the operation portion 11a and is provided with a module attachment and detachment mechanism with respect to the device main body 1. Since the module attachment and detachment mechanism is similar to that in the case of the power source module, description thereof will be omitted.

According to the embodiment, a module is easily attached and detached in a small-sized electronic device with a module that is detachably attached thereto, and it is possible to reliably attach the module. In addition, it is possible to avoid local concentration of heat sources in the electronic device and to extend an operation time of the device. Note that although the configuration in which the locking member 11 is provided in the module 20 has been exemplified in the embodiment, a form in which the locking member 11 is provided in the device main body 1 is also possible.

Second Embodiment

Figure 7A:
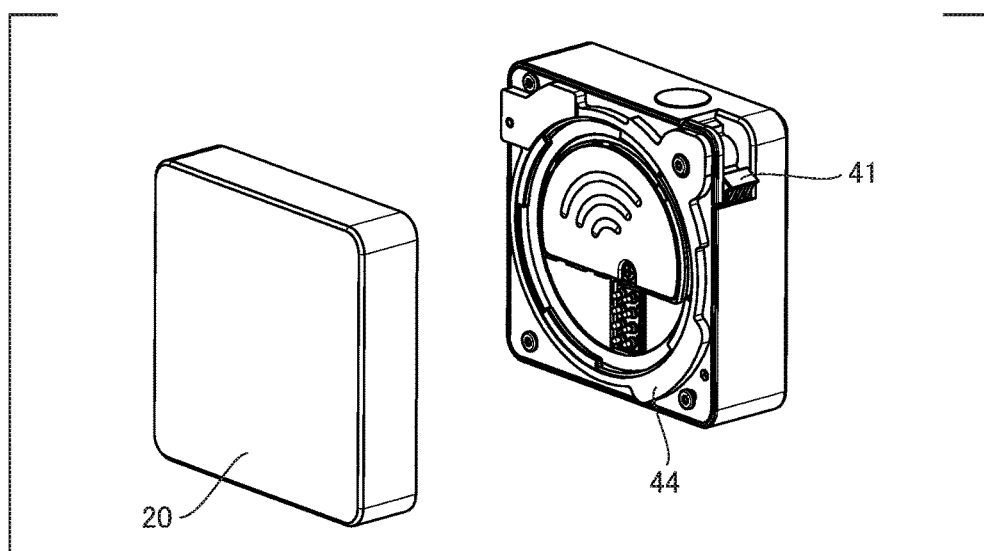
FIGS. 7A and 7B are exterior perspective views illustrating a module removed from an electronic device according to a second embodiment of the present invention.
Figure 7B:
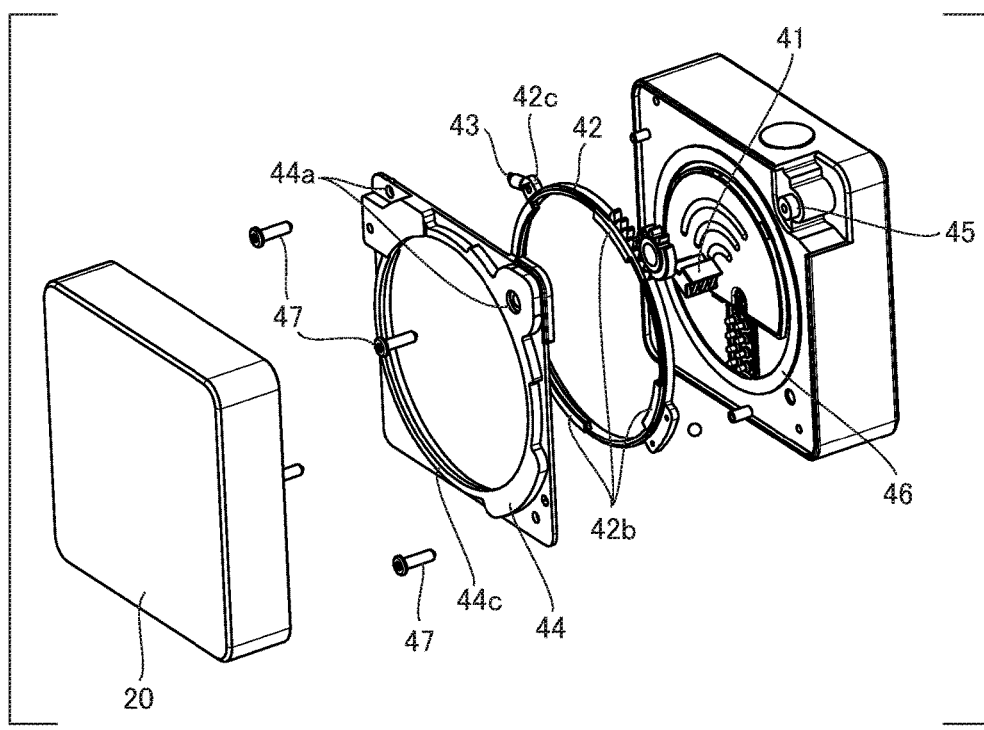

Next, a second embodiment of the present invention will be described with reference to FIGS. 7 and 8. FIG. 7A is a perspective view in which a removed state of the module from the device main body according to the embodiment is viewed from the back face side. FIG. 7B is an exploded perspective view in that state. Hereinafter, only differences from the first embodiment will be described, and the same reference numerals that have already been used will be used for components that are similar to those in the first embodiment, and detailed description thereof will be omitted. Description will be similarly omitted in this manner in the embodiments described later.

The device main body 1 includes an operation portion 41 of a locking member. The operation portion 41, a ring-shaped portion 42, and claw portions 42b (four positions) provided therein are formed as separate parts. The device main body 1 includes a rotation shaft 45 for the operation portion 41. The operation portion 41 is inserted into the rotation shaft 45 of the device main body 1 so as to be able to turn. In order to reduce the sound of collision against a portion of the device main body 1 with which it may come into contact, which can occur when the user operates the operation portion 41, the operation portion 41 is formed of resin such as polyacetal (POM) or polyamide (PA). The ring-shaped portion 42 of the locking member slidably fits in a state in which the ring-shaped portion 42 is interposed between a sliding surface 46 of the device main body 1 and the flange portion 44c of a fixed mount portion 44.

A first teeth portion 41a is formed in an outer periphery of a shaft fitting portion of the operation portion 41. A second teeth portion 42d is formed in a predetermined range of an outer circumferential portion of the ring-shaped portion 42. The first teeth portion 41a and the second teeth portion 42d mutually mesh with each other in an assembled state (see FIGS. 8A and 8B). The ring-shaped portion 42 is biased in a predetermined direction (the counterclockwise direction in FIGS. 8A and 8B) by an elastic member 43. The elastic member 43 has one end attached to an attachment portion 42c provided in the ring-shaped portion 42 and has an end on the opposite side, which is attached to an attachment portion provided in the device main body 1. A plurality of through-holes 44a are formed at edges of the fixed mount portion 44, and a plurality of screws 47 are inserted thereinto. The screws 47 inserted into the through-holes 44a are fastened to tap holes in the device main body 1.

Figure 8A:
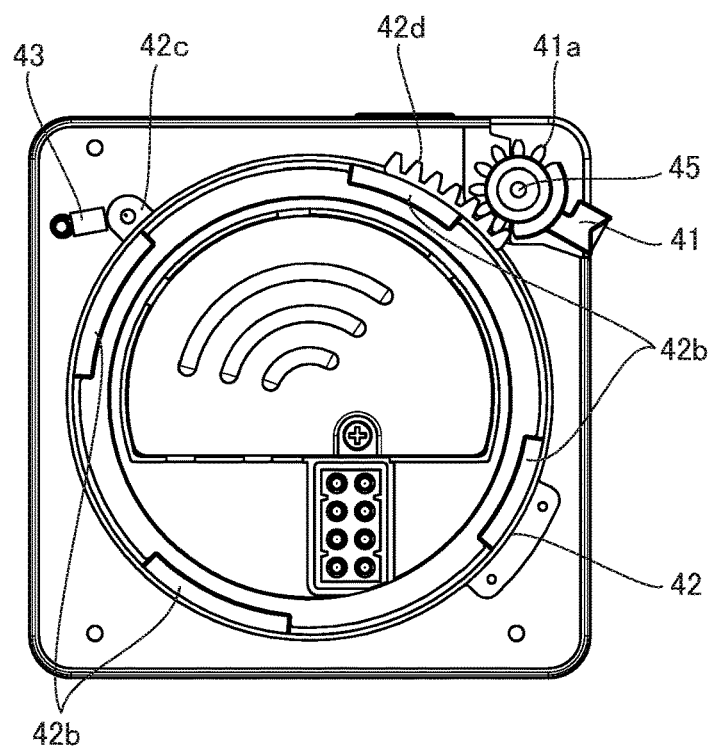
FIGS. 8A and 8B are diagrams for explaining state transition of the electronic device according to the second embodiment.
Figure 8B:
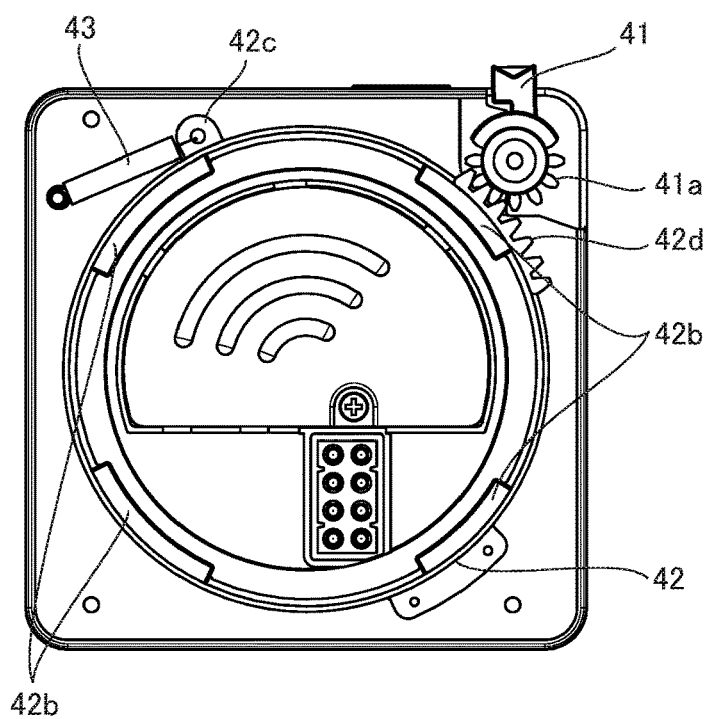

FIGS. 8A and 8B are diagrams for explaining the electronic device in a state in which the modules have been removed. FIG. 8A is a diagram illustrating a state in which a module has been attached to the device main body 1. FIG. 8B is a diagram illustrating a state in which the module has been removed from the device main body 1. Both diagrams show a state in which the device main body 1 is viewed from the back face side.

The ring-shaped portion 42 is biased in the counterclockwise direction in FIGS. 8A and 8B by the elastic member 43 in a state in which the module 20 has been attached to the device main body 1. Since the first teeth portion 41a meshes with the second teeth portion 42d of the ring-shaped portion 42 in the operation portion 41, a turning force in the clockwise direction in FIGS. 8A and 8B is transmitted. Although claw portions of the module 20 are not illustrated in FIGS. 8A and 8B, a plurality of claw portions 42b of the ring-shaped portion 42 and a plurality of claw portions provided in the module 20 overlap in projection when viewed from a direction perpendicular to the paper plane of FIGS. 8A and 8B, and the module 20 is retained. That is, a positional relationship in which the claw portions are engaged with each other has been achieved.

When the module is removed, the user performs an operation of turning the operation portion 41 in the counterclockwise direction. Since the second teeth portion 42d meshes with and is coupled with the first teeth portion 41a of the operation portion 41, the ring-shaped portion 42 is turned in the clockwise direction in FIGS. 8A and 8B against an elastic force of the elastic member 43. At this time, the elastic member 43 is in a stretched state. The plurality of claw portions 42b of the ring-shaped portion 42 are turned to a position at which the claw portions 42b do not overlap with the plurality of claw portions provided in the module 20 when viewed in a direction perpendicular to the paper plane of FIGS. 8A and 8B in projection. That is, a positional relationship in which the claw portions are not engaged with each other is achieved, and the attachment of the module 20 can be released. If the user releases an operation force that has been applied to the operation portion 41 at the non-engaged position, the locked ring-shaped portion 42 is turned in the counterclockwise direction, and the operation portion 41 is moved in the clockwise direction by the elastic force of the elastic member 43.

In the embodiment, the user performs an operation of turning the operation portion 41 provided in the device main body 1 when the module is attached and removed. As illustrated in FIG. 8A, the operation portion 41 slightly projects from the case body of the module 20 when the ring-shaped portion 42 is located at the locked position. In the embodiment, the operation portion 41 even slightly projects from the case body of the device main body 1 when the ring-shaped portion 42 is located at the locked position. As illustrated in FIG. 8B, the projection amount by which the operation portion 41 projects from the case body of the module increases when the ring-shaped portion 42 is located at the lock released position. In the embodiment, the projection amount by which the operation portion 41 projects from the case body of the device main body 1 also increases when the ring-shaped portion 42 is located at the lock released position.

Third Embodiment

Figure 9A:
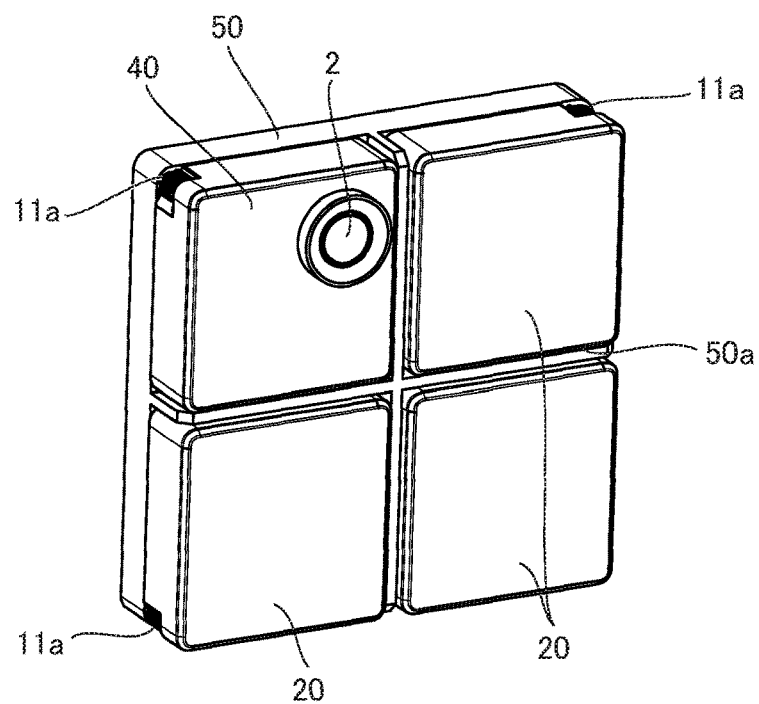
FIGS. 9A and 9B are exterior perspective views of an electronic device according to a third embodiment of the present invention.
Figure 9B:
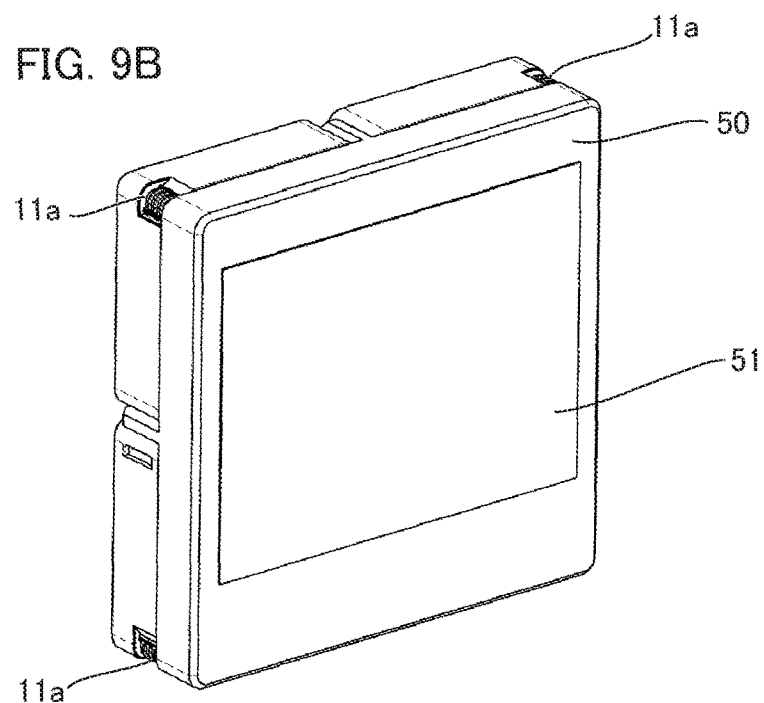

Next, a third embodiment of the present invention will be described with reference to FIGS. 9A and 9B. FIG. 9A is a perspective view in which an electronic device according to the embodiment is viewed from the front side. FIG. 9B is a perspective view in which the state is viewed from the back side. A state in which four modules 20 have been attached to a device main body 50 is illustrated.

A cross-shaped rib 50a is formed in a front face portion of the device main body 50. The front face portion of the device main body 50 is divided into four left, right, upper, and lower regions by the rib 50a. The modules 20 are respectively attached to the four regions. The rib 50a serves as a guide when the modules are attached to the device main body 50 and also has a function of enhancing rigidity of the device main body 50.

A plurality of modules can be attached to the front face portion of the device main body 50, and FIG. 9A illustrates a state in which a camera module 40 and other modules have been attached. The other modules include a power source module, an external I/O module, an NFC module, a communication module, a speaker module, a microphone module, a recording module, and the like. The attachment and the detachment mechanism of the respective modules is the same as that in the first embodiment.

The camera module 40 attached to the upper left position in FIG. 9A will be described in detail as an example. The camera module 40 includes a lens 2, optical members such as a diaphragm, and an imaging element that form an imaging optical system. A control portion in the camera module 40 performs control such as automatic zoom control, and control of automatic exposure (AE) for optimally setting an aperture value and a shutter speed, and imaging element sensitivity, automatic focus adjustment (AF), automatic white balance (AWB), and the like. An image signal acquired by the imaging element is processed by an image processing circuit, and an image recording circuit records the image signal in an image recording memory or the like. Camera modules 40 of several different types with different focal distances are provided, and the user can use a camera module 40 by attaching the camera module 40 to the device main body 1 in accordance with a purpose of image capturing. In a case in which the camera module 40 is attached to the device main body 1, the electronic device then has a specification mainly for performing operations of imaging stationary images and movies.

As illustrated in FIG. 9B, the device main body 1 includes a display portion 51 on a back surface portion thereof. The display portion 51 has a display device such as a LCD (liquid crystal display). The display portion 51 is used for checking a subject image and reproducing and displaying a captured image. The display portion 51 according to the embodiment includes a protection window, a touch panel, and a display panel. The protection window is formed of reinforced glass or transparent resin such as acrylic resin or polycarbonate resin with high transmittance for light in order to protect the display panel and the touch panel from scratching and contamination, and the thickness thereof is equal to or less than 1 mm. The outer size of the protection window is greater than that of the display panel to protect the entire display panel. The touch panel is of an electrostatic capacitance type, and wiring thereof is formed of ITO (indium tin oxide) that is a transparent conductive film. Although a substrate is generally formed of glass, it is also possible to use a plastic substrate made of acrylic resin, polycarbonate, or the like as long as the plastic substrate is transparent and can cope with an annealing temperature and the like of ITO.

According to the embodiment, it is possible to realize a configuration with which a module can be easily and reliably attached to a device main body without causing any problems in size reduction and thickness reduction. In addition, it is possible to customize the electronic device in accordance with a use purpose of the user. Further, it is possible to handle a case in which the module has to be replaced due to a malfunction or the like or the module has been updated or improved simply with replacement in units of modules. That is, since the device main body can be used as it is, it is possible to provide an inexpensive electronic device that also takes effects on the environment into consideration.

Fourth Embodiment

Figure 11:
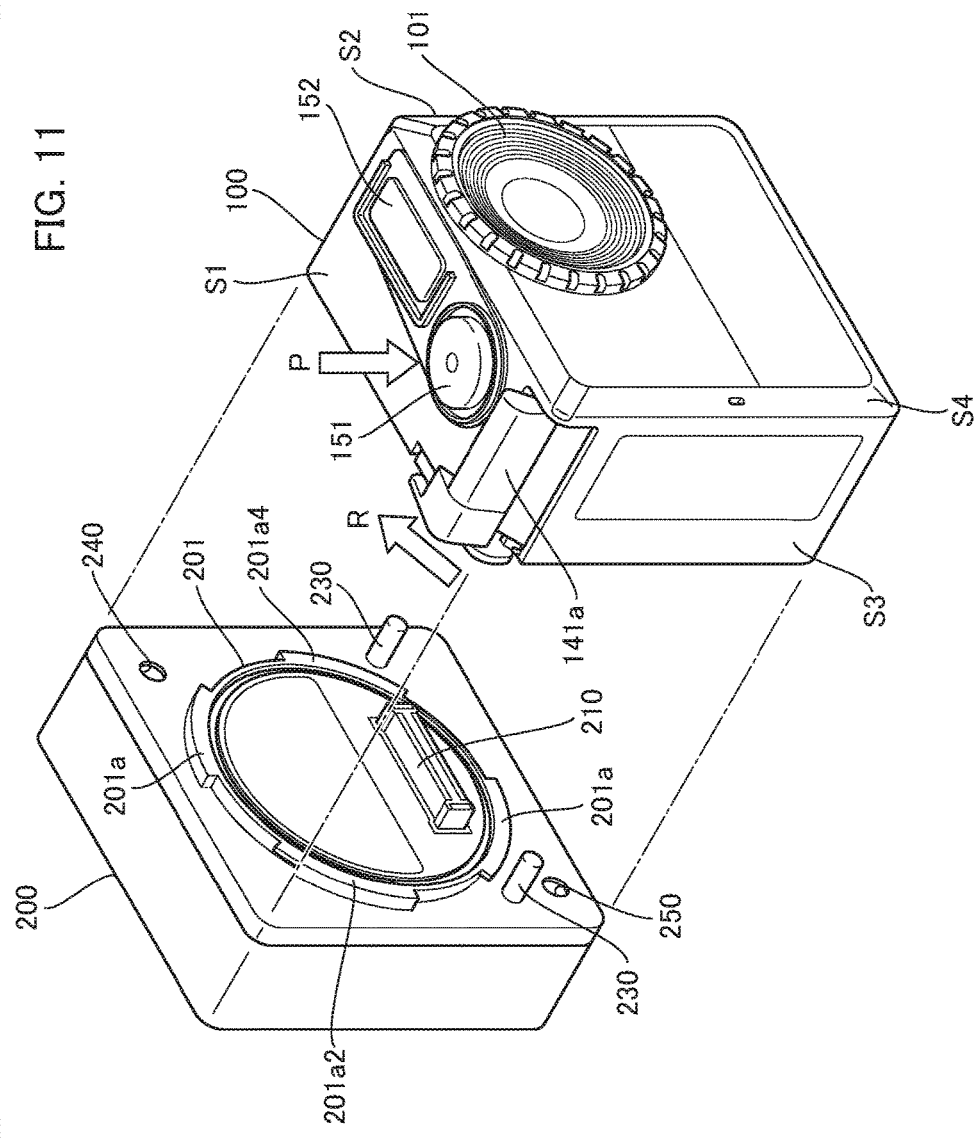
FIG. 11 is a perspective view illustrating, from a front face side, a device main body with a module removed therefrom according to the fourth embodiment.
Figure 12:
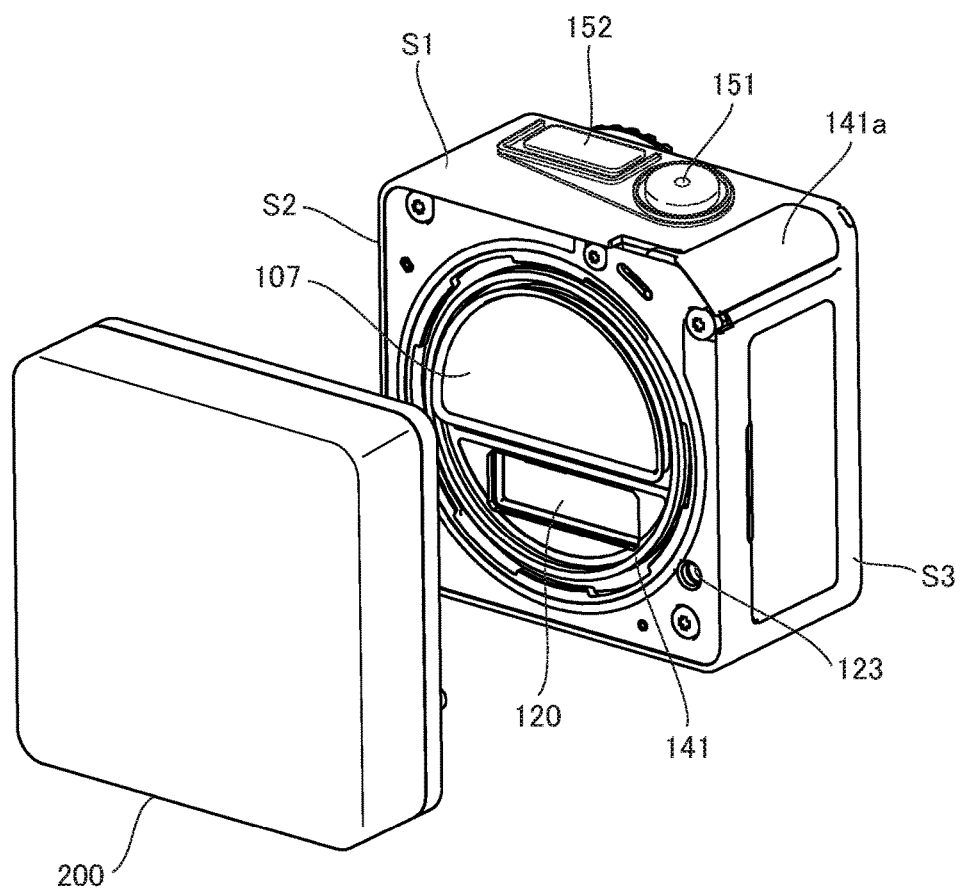
FIG. 12 is a perspective view illustrating, from a back face side, the device main body with the module removed therefrom according to the fourth embodiment.
Figure 13:
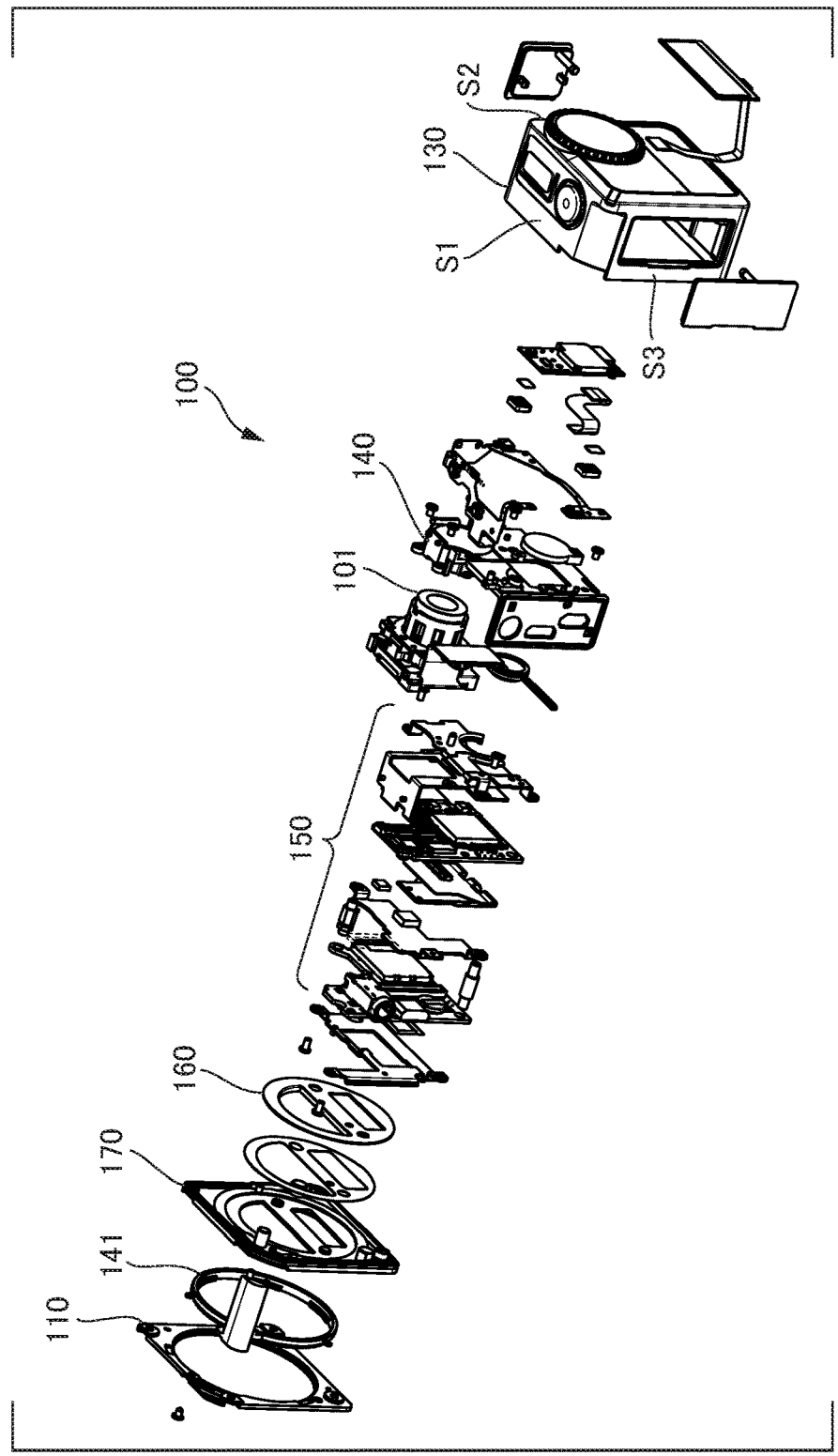
FIG. 13 is an exploded perspective view of the device main body according to the fourth embodiment.

Next, a fourth embodiment of the present invention will be described. For attaching a module 200 to a device main body 100, attachment and detachment based on the bayonet scheme can be employed by turning the locking member. FIG. 10 is a perspective view in which a state of the device main body 100 with the module 200 attached thereto is viewed from the front face side according to the embodiment. FIG. 11 is a perspective view in which a state of the device main body 100 with the module 200 removed therefrom is viewed from the front face side. FIG. 12 is an exploded perspective view in which a state of the device main body 100 with the module 200 removed therefrom is viewed from the back face side. FIG. 13 is an exploded perspective view of the device main body 100. The device main body 100 is a camera module, and the module 200 is a power source module that has a battery.

The device main body 100 includes an imaging portion 101 that is exposed to a front surface. The imaging portion 101 includes optical members such as a lens and a diaphragm that forms an imaging optical system and an imaging element. Hereinafter, an upper surface of a case body 130 of the device main body 100 is defined as a first surface S1. From among the plurality of side surfaces that substantially perpendicularly intersect the front surface of the case body 130, a side surface near the front surface in which the imaging portion 101 is disposed is defined as a second surface S2, and a side surface, which is different from the second surface S2, of the case body 130 is defined as a third surface S3. Note that a connector portion 120, which will be described later, is disposed on a back face of the device main body 100 on the side opposite to the front surface in which the imaging portion 101 is disposed in an exposed manner. Therefore, the aforementioned first surfaces S1 to the third surfaces S3 are surfaces that are different from the front surface and the back face as described above in the device main body 100. In the embodiment, the second surface S2 is a right side surface when viewed from the front face side, and the third surface S3 is a left side surface when viewed from the front face side. A surface S4 formed in the periphery of the front surface is a tapered surface. The second surface S2 is not adjacent to the third surface S3, and the imaging portion 101 is located in the vicinity of the first surface S1 and the second surface S2. Note that it is only necessary for the imaging portion 101 to be located at least in the vicinity of the first surface S1 (for example, a location on the center upper side or the like) in the front surface of the device main body 100.

A locking operation portion 141a and operation members 151 and 152 are arranged as operation members in the side surface portion of the case body 130 of the device main body 100. The locking operation portion 141a is a locking lever that is integrally provided with a locking member 141, which will be described later. The locking operation portion 141a is disposed in the vicinity of the third surface S3 that is not adjacent to (not in the vicinity of) at least one of the first surface S1 and the second surface S2. In the embodiment, since the locking operation portion 141a is arranged in the vicinity of (edge) of the first surface S1 and the third surface E3, the locking operation portion 141a is located at a position that is not adjacent to the second surface S2. As illustrated in FIG. 10, the locking operation portion 141a is substantially within a projection area in a state in which the module 200 has been attached to the device main body 100, in a case in which the device main body 100 is viewed from the front surface side. In a case of FIG. 11 in which the attachment of the module 200 to the device main body 100 has been released, the locking operation portion 141a has moved to the position at which the locking operation portion 141a projects from the projection area outside as represented by the arrow R.

The operation members 151 and 152 are arranged on the first surface S1. The operation member 151 near the locking operation portion 141a is an operation member for outputting an operation signal in response to a user's operation, and in the embodiment, the operation member 151 is a release button that the user uses when providing an instruction for imaging a subject. In addition, the operation member 152 is an operation member for outputting an operation signal that is different from that of the operation member 151. The operation member 152 is arranged at a position closer to the imaging portion 101 than the operation member 151, that is, at a position near the optical axis of the imaging optical system.

A chassis 140, a circuit substrate portion 150, a heat releasing portion 160, a holding member 170, and a locking member 141 are provided in an internal space formed by the case body 130 and a back face panel 110 of the device main body 100 (FIG. 13). The heat generated by the circuit substrate portion 150 can diffuse to the side of the module 200 via the heat releasing portion 160.

The module 200 includes a case body that can be connected to the device main body 100 by bayonet coupling. The module 200 has a ring-shaped portion 201 in a front surface portion connected to the device main body 100. A plurality of claw portions 201a are formed in a circumferential direction in the ring-shaped portion 201 and are respectively engaged with a plurality of claw portions formed in the locking member 141. The module 200 has a connector portion 210 inside the ring-shaped portion 201. The connector portion 210 is electrically connected to the connector portion 120 (see FIG. 12) provided in the device main body 100. In the embodiment, the connector portion 210 of the module 200 is a plug that projects forward, and the connector portion 120 of the device main body 100 is a socket.

A plurality of engagement convex portions 230 provided in the front surface portion of the module 200 are engagement pins arranged on both left and right sides of the connector portion 210 outside the ring-shaped portion 201. Engagement concave portions 123 (FIGS. 12 and 14) respectively corresponding to the plurality of engagement convex portions 230 are formed in the back faces of the device main body 100 such that the engagement convex portions 230 are engaged with the engagement concave portions 123 when the module 200 is attached. The plurality of engagement convex portions 230 serves as a guide that guides the module 200 when the user tries to attach the module 200 to the device main body 100 and serves to safely and reliably establish the connection of the connector portion 210. In addition, the plurality of engagement convex portions 230 also serves to protect the connector portion 210. Since the amount of projection of the engagement convex portions 230 is greater than the amount of projection of the connector portion 210 with reference to the front surface of the module 200, it is possible to avoid direct application of impact caused by dropping of the module 200, for example, to the connector portion 210. In addition, concave portions 240 and 250 (FIG. 11) that fit onto convex portions provided in another module device (not illustrated) are formed in a surface of the module 200 which comes into contact with the device main body 100. Since no convex portions corresponding to the concave portions 240 and 250 are provided in the device main body 100, it is possible to distinguish the device main body 100 from another module device in terms of connection. Another module device will be described later with reference to FIGS. 26 and 27.

Figure 14:
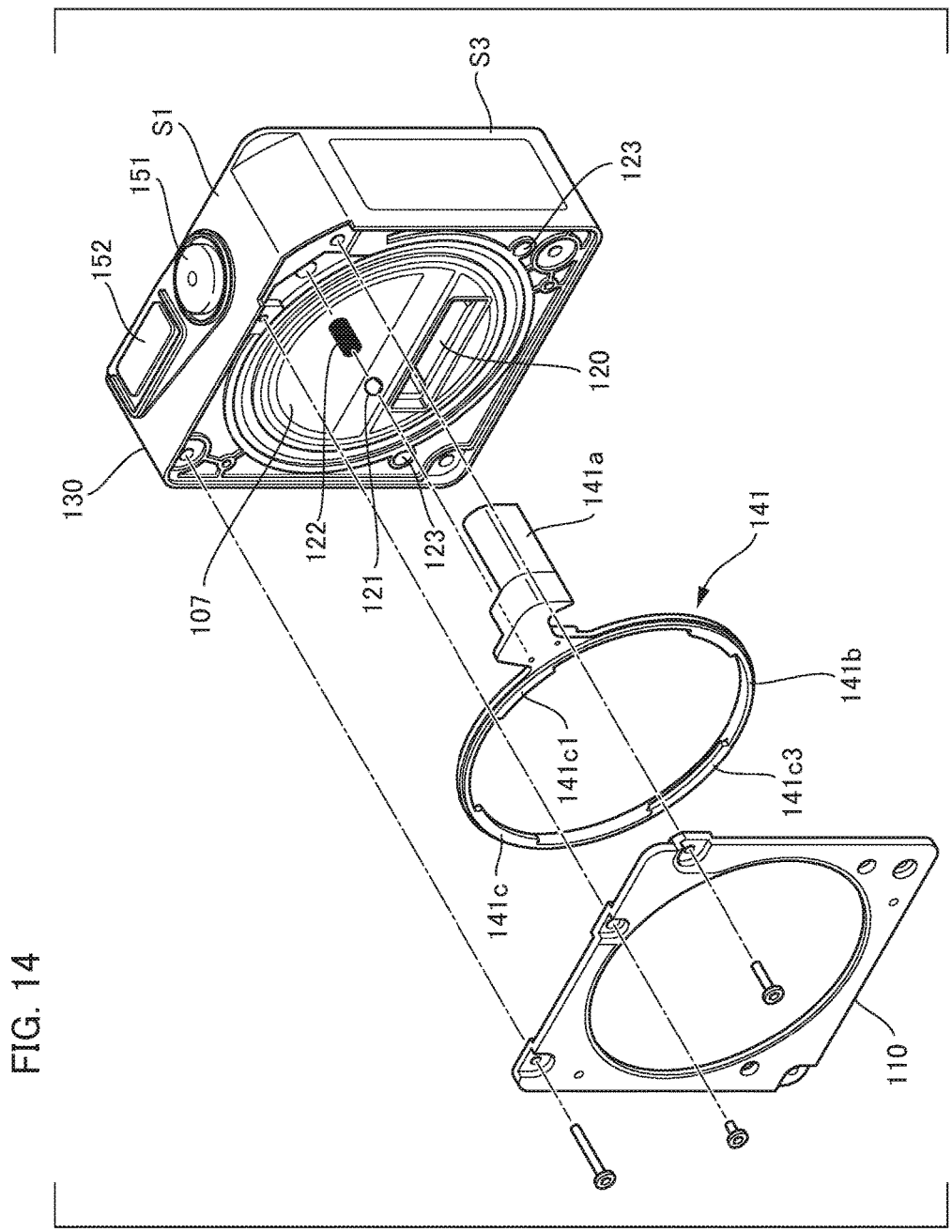
FIG. 14 is an exploded perspective view illustrating a back surface portion of the device main body according to the fourth embodiment.
Figure 15A:
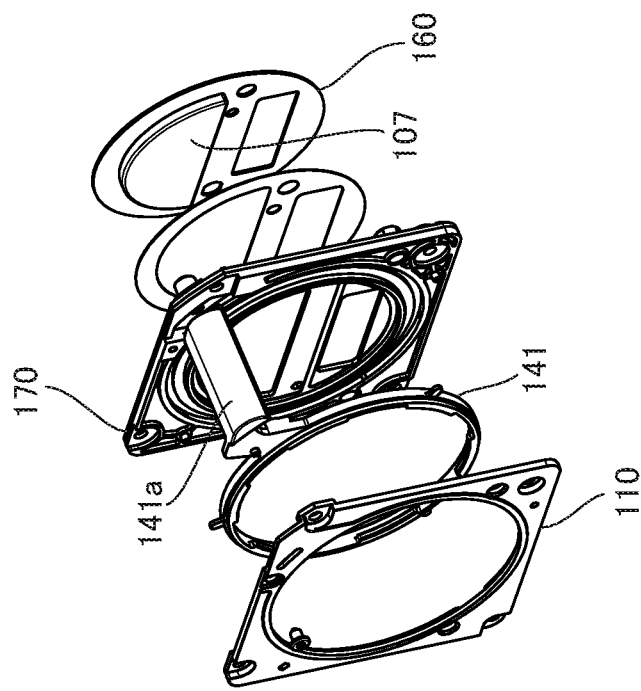
FIGS. 15A and 15B are exploded perspective views illustrating a part of the device main body according to the fourth embodiment in an exploded manner.
Figure 15B:
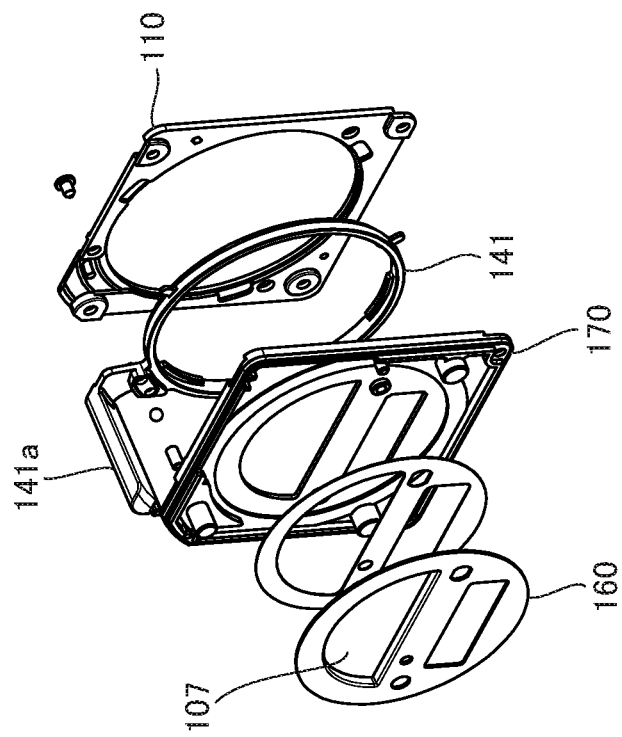

FIG. 14 is an exploded perspective view illustrating the device main body 100 from the back face side in a partially exploded manner. FIGS. 15A and 15B are exploded perspective views illustrating circumferential portions of the locking member 141 and the heat releasing portion 160. The locking member 141 is arranged between the back face panel 110 of the device main body 100 and the case body 130. In a manner similar to that in the first embodiment, the locking operation portion 141a, a ring-shaped portion 141b, and the plurality of claw portions 141c provided therein are formed as an integrated part in the locking member 141. The claw portions 141c are bayonet claws. The locking operation portion 141a and the ring-shaped portion 141b are integrally turned. The locking member 141 moves between a locked portion at which connection with the module 200 has been established by the bayonet coupling and an unlocked position (lock released position) in which the locking with the module 200 has been released. In a manner similar to in the first embodiment, the locking member 141 is configured to be held in the locked position or the unlocked position by the metal spherical body 121 and the biasing member (elastic member) 122 thereof.

Figure 16A:
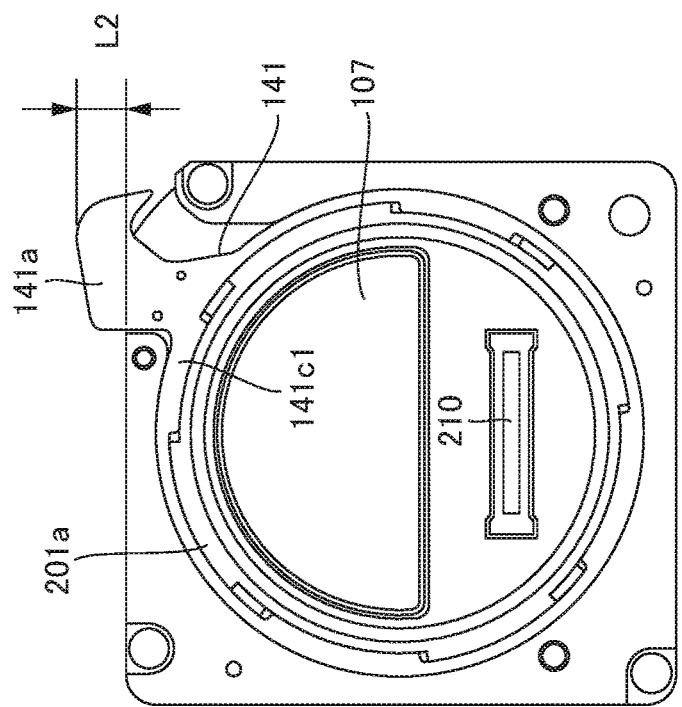
FIGS. 16A and 16B are diagrams for explaining a locked position and an unlocked position according to the fourth embodiment.
Figure 16B:
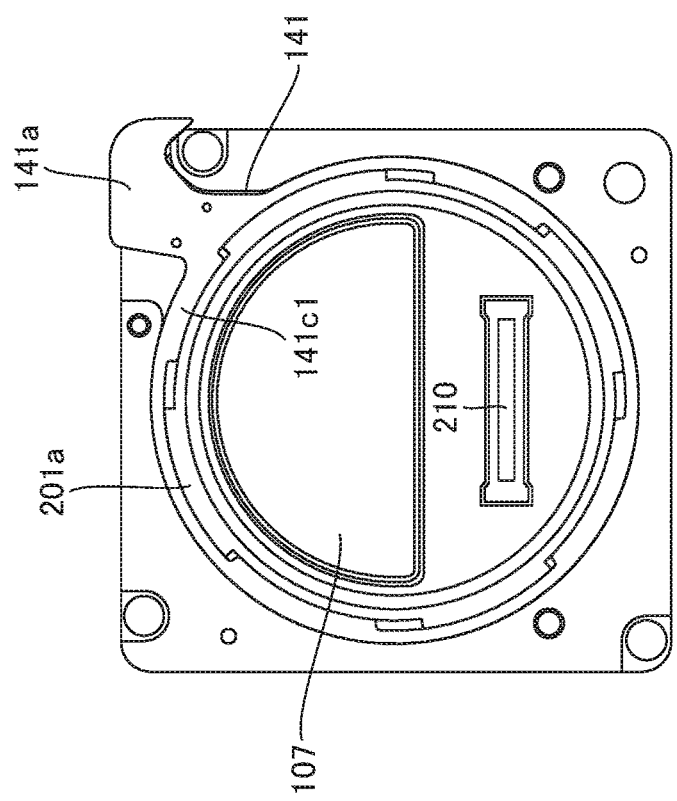

FIGS. 16A and 16B are sectional views for explaining the locked position and the unlocked position of the locking member 141 when viewed from the back face side. FIG. 16A illustrates the locking member 141 in the locked position, and FIG. 16B illustrates the locking member 141 in the unlocked position. FIGS. 17A and 17B are perspective views illustrating an engagement relationship between the locking member 141 and the module 200 from the front surface side. FIG. 17A illustrates a state in which the locking member 141 is in the locked position, and FIG. 17B illustrates a state in which the locking member 141 is in the unlocked position. Note that portions with no direct relationship with the gist of the present invention in the camera 100 and the module 200 are not illustrated.

The locking member 141 is in the state in which the plurality of claw portions 141c respectively are engaged with a plurality of claw portions 201a formed in the module 200, in the locked position. At this time, the locking operation portion 141a is in a state in which the locking operation portion 141a does not project outside of the projection area in a case in which the device main body 100 is viewed from the front surface side, and the amount of projection in the locked position is less than the amount of exposure in the unlocked position. If the user operates the locking operation portion 141a, and the locking member 141 is turned in the counterclockwise direction in FIGS. 16A and 16B, engagement between the device main body 100 and the module 200 is released. At this time, the locking operation portion 141a is in a state in which the locking operation portion 141a projects to the outside of the projection area in a case in which the device main body 100 is viewed from the front surface side. That is, the locking operation portion 141a formed to extend from the locking member 141 projects from the external form of the device main body 100 in the unlocked position of the locking member 141.

FIG. 18 is an exploded perspective view illustrating a configuration example of the module 200. The module 200 includes a front surface portion 212, a substrate portion 213, a battery portion 216, and a cover member 218. The connector portion 210 provided in the substrate portion 213 is exposed to the outside through an opening 212a formed in the front surface portion 212.

In the embodiment, the imaging portion 101 is arranged in the vicinity of the first surface S1 and the second surface S2 of the case body 130 of the device main body 100, and the locking operation portion 141a is arranged in the vicinity of the first surface S1 and the third surface S3 (FIGS. 10 and 11). For example, the user can operate the locking operation portion 141a even in a state in which an attachment is attached to the lens of the imaging portion 101. The attachment includes, for example, a lens hood, a wide-angle attachment that increases an angle of view in which imaging can be performed, a fish-eye attachment that enables fish-eye imaging, and the like and can be attached to the imaging portion 101. It is not necessary for the user to perform complicated operations in relation to the attachment and the detachment between the device main body 100, to which the attachment has been attached, and the module 200. In addition, the user can minimize damage to the lens and adhesion of fingerprints on the front surface of the lens when the user operates the locking operation portion 141a in an application to a small-sized camera module.

Next, a relationship between the locking operation portion 141a and the operation member 151 will be described with reference to FIGS. 10 to 16. The operation member 151 is arranged in the first surface S1 of the device main body 100, and the amount of protrusion thereof is represented as L1 (see FIG. 10). The operation member 151 according to the embodiment is a release button used by the user to provide an instruction for capturing an image, and an operation direction P is a pressing direction.

If the amount by which the locking operation portion 141a projects is represented as L2, the amount of projection from the external form of the device main body 100 in the locked position in FIG. 16A (hereinafter, referred to as L2) is substantially zero, which is equal to or less than the amount by which the operation member 151 projects. Meanwhile, the amount L2 by which the locking operation portion 141a projects is greater than the amount L1 by which the operation member 151 projects (L2>L1) in the unlocked position in FIG. 16B. At this time, the locking operation portion 141a is located at a position at which the locking operation portion 141a overlaps the operation member 151 when the device main body 100 is viewed from the first surface side (upper side). The direction in which the user operates the locking operation portion 141a when the user performs a locking release operation is a direction in which the locking operation portion 141a projects from the first surface S1.

For example, a case in which a release operation has been performed in the unlocked state and an imaging operation has been performed can be assumed. In this case, there is a likelihood that if the connection between the device main body 100 and the module 200 is unexpectedly released, a captured image will not be able to be recorded for the reason that power is not being supplied or the like. In the embodiment, it is possible to prevent an inadvertent operation on the device main body 100 in the unlocked state (locking released state). That is, the operation direction of the locking operation portion 141a in a case in which the locking is released is substantially an opposite direction to the operation direction (pressing direction) of the operation member 151. If the user operates the operation member 151 in the pressing direction and a finger is then inadvertently brought into contact with the locking operation portion 141a, the unlocked state is not achieved. Therefore, this is effective in preventing inadvertent operations. In addition, the amount by which the locking operation portion 141a projects is greater than the amount by which the operation member 151 projects with reference to the first surface S1 in the unlocked state. Therefore, it is possible to prevent the release operation on the operation member 151 by the user in the unlocked state.

In addition, the operation member 152 is at a closer position to the optical axis of the imaging portion 101 than the operation member 151 on the first surface S1 of the device main body 100. Therefore, there is substantially no likelihood of inadvertent operations due to contact of a finger with the locking operation portion 141a when the user operates the operation member 152. Note that this operation member 152 is less frequently operated during image capturing than the operation member 151. That is, it is possible to prevent an input of an unintended operation by the user in the unlocked state in a case in which it is necessary to arrange the operation member 151 that is more frequently operated during the image capturing so as to be closer to the projecting position of the locking operation portion 141a in the unlocked state.

Figure 19A:
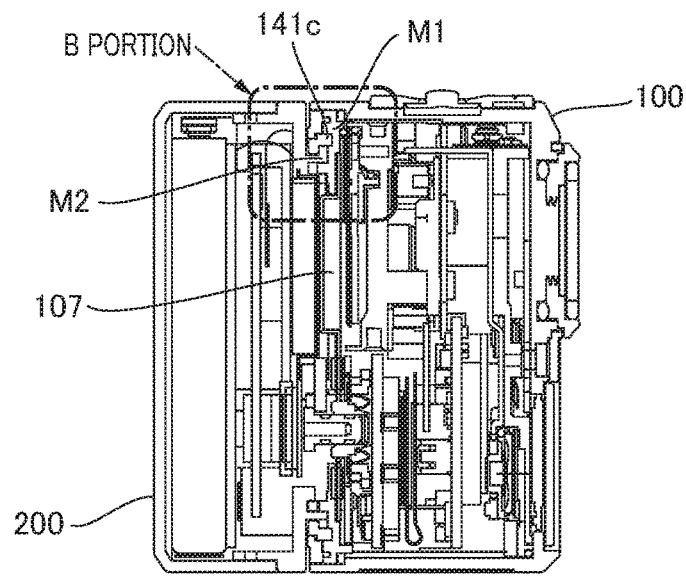
FIGS. 19A and 19B are sectional views of a state in which a module is attached to the device main body according to the fourth embodiment.
Figure 19B:
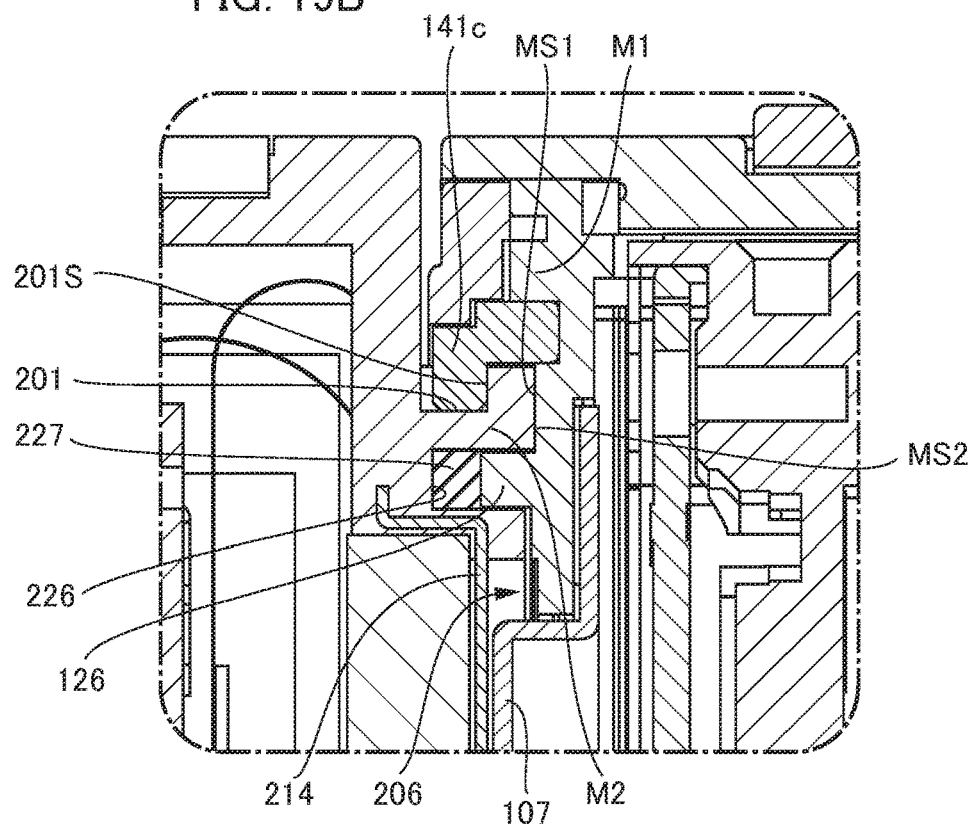
Figure 20:
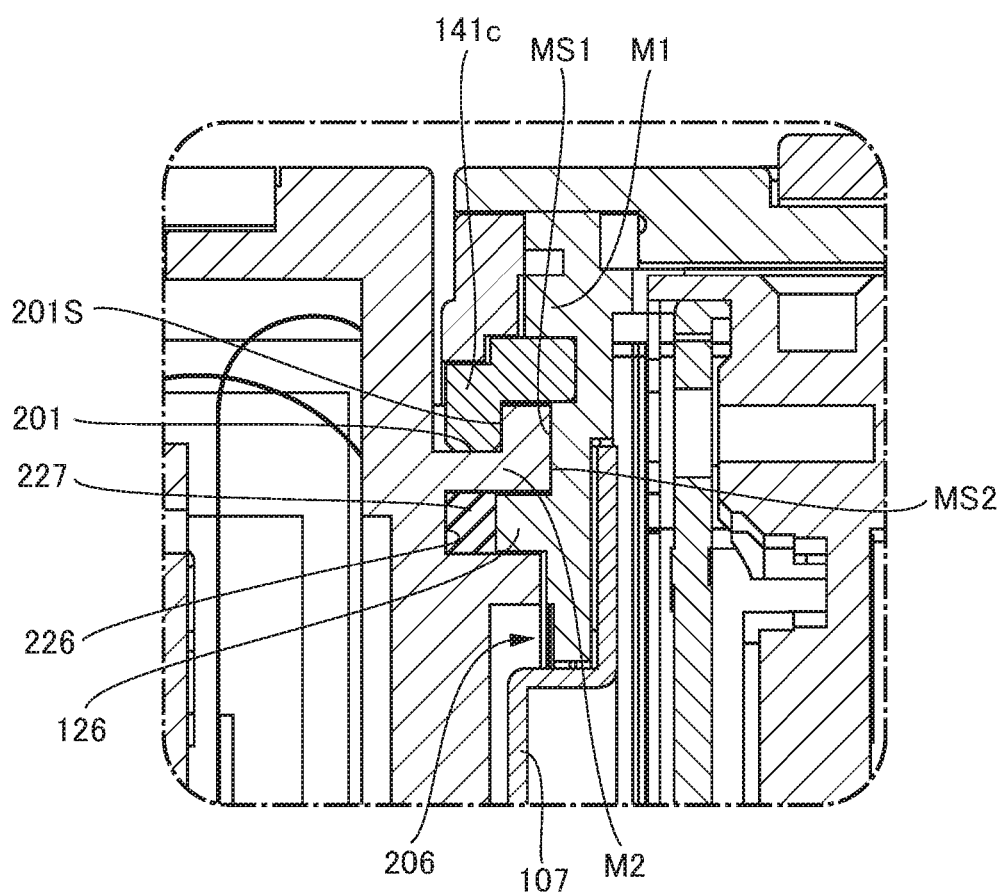
FIG. 20 is an enlarged view (in a case in which no heat transfer member is provided) illustrating a B portion in FIG. 19A.

Next, heat transfer from the device main body 100 to the module 200 will be described with reference to FIGS. 19A and 19B. FIG. 19A is a vertical sectional view illustrating a state in which the module 200 has been attached to the device main body 100. FIG. 19B is an enlarged view illustrating a B portion in FIG. 19A. FIG. 20 is an enlarged view illustrating the B portion in FIG. 19A and is a diagram for explaining a case in which a heat transfer member 214 is not provided.

The attachment of the module 200 to the device main body 100 is performed by a first mount portion M1 provided in the back surface portion of the device main body 100 and a second mount portion M2 provided in the front surface portion of the module 200. The first mound portion M1 has a first mount reference surface MS1 formed in the circumferential direction. In addition, the second mount portion M2 has a second mount reference surface MS2 formed in the circumferential direction so as to face the first mount reference surface MS1. The second mount reference surface MS2 corresponds to a front end surface of the ring-shaped portion 201 and comes into contact with the first mount reference surface MS1 in a locked state.

The device main body 100 includes a heat releasing member 107 provided to project backward (the side of the module 200) inside the first mount portion M1 and beyond the first mount reference surface MS1. The heat releasing member 107 is a member that releases heat generated by a heat source inside the device main body 100 in a manner similar to that of the heat releasing panel 7 described above in the first embodiment.

The claw portions 141c of the locking member 141 project backward beyond the first mount reference surface MS1. The module 200 includes a contact surface 201S that can be engaged with the claw portions 141c in a state in which the module 200 can be attached to the device main body 100 from the back side. The contact surface 201S is formed in the ring-shaped portion 201 in the second mount portion M2 and is located behind the second mount reference surface MS2. A concave portion 206 is formed inside the second mount portion MS2 in order to reduce interference with the heat releasing member 107. The concave portion 206 is formed behind the second mount reference surface MS2, and a heat transfer member 214 that transfers heat from the heat releasing member 107, for example, is arranged in the concave portion. Since the heat transfer member 214 is similar to the heat transfer member 14 in the first embodiment, detailed description thereof will be omitted.

In the embodiment, it is possible to separate the heat releasing member 107 formed of a metal material or the like from the case body 130 of the device main body 100 by causing the heat releasing member 107 to project beyond the first mount reference surface MS1. In addition, the heat releasing member 107 is arranged inside the first mount portion M1 formed in the circumferential direction. Therefore, it is possible to secure a sufficient heat releasing area, to increase the contact area between the claw portions 141c and the contact surface 201S, and to improve strength. Since the concave portion 206 is formed in the module 200, it is possible to reduce interference with the heat releasing member 107 in the state in which the module 200 is attached to the device main body 100. In a case in which the heat transfer member 214 is arranged in the concave portion, the heat transfer member 214 is in contact with the heat releasing member 107, however, it is possible to sufficiently reduce the interference between the members as long as the heat transfer member 214 and the heat releasing member 107 are configured to be able to elastically contact in contact with each other. In addition, in a case in which the module has a cooling portion, the heat generated in the device main body 100 is accumulated through the concave portion 206. Note that although the contact surface 201S that can be engaged with the claw portions 141c is exemplified as a surface perpendicular to the optical axis direction in the embodiment, the contact surface 201S may be a surface at any predetermined angle with respect to the optical axis direction. In addition, in a case in which the module 200 is configured not to include the heat transfer member 214 as illustrated in FIG. 20, a clearance occurs between the heat releasing member 107 and the concave portion 206 in a state in which the module 200 has been attached to the device main body 100. It is also possible to reduce, due to the concave portion 206, the interference from the heat releasing member 107 in the state in which the module 200 has been attached to the device main body 100 in this case.

Here, a positional relationship between the heat releasing member 107, the connector portion 120, the engagement concave portions 123, a locking operation portion 141a, a connector portion 210, and an engagement convex portion 230 will be described in detail with reference to FIGS. 11 and 12. The connector portion 120 is disposed below the heat releasing member 107 in the back face of the device main body 100. Therefore, the connector portion 210 is disposed above the concave portion 206 in the front surface of the module 200 in a state in which the module 200 has been attached to the device main body 100. With this configuration, it is possible to reduce a degree at which the heat diffused from the heat releasing member 107 is delivered to the connector side in a normal position (first state) of the device main body 100, which is the most frequently used, in which the first surface S1 faces the side opposite to a direction or gravity, as illustrated in FIG. 10.

In addition, the engagement concave portions 123 are provided in the vicinity of the connector portion 120 and on the outer side of the connector portion 120 (on the side closer to the external form of the case body 130) in the back face of the device main body 100. In addition, the engagement concave portions 123 are provided in the vicinity of two corners that are different from two corners near the locking operation portion 141a, from among the four corners of the back face of the device main body 100 on the side opposite to the locking operation portion 141a with the connector portion 120 interposed therebetween. Therefore, the engagement convex portions 230 are provided in the vicinity of the connector portion 210 and on the side opposite to a region of the module 200 that faces the locking operation portion 141a in a state in which the device main body 100 has been attached to the module 200 with the connector portion 210 interposed therebetween, in the front surface of the module 200. Note that a positional relationship in which a tangential line of the two engagement convex portions 230 is substantially parallel with a side of the connector portion 210 in the longitudinal direction is achieved. With the aforementioned configuration, it is possible to minimize the external form dimensions of the device main body 100 and the module 200. In addition, since it is possible to increase a probability of the engagement convex portion 230 being brought into contact with the outside before the connector portion 210 in a state in which the connector portion 210 is exposed to the outside, for example, it is possible to more effectively protect the connector portion 210.

Next, measures for water proofing and prevention of entry of foreign matter will be described with reference to FIGS. 19A and 19B.

A convex portion 126 is formed inside the first mount portion M1 in the device main body 100. The convex portion 126 is located further inside the first mount reference surface MS1 and projects backward (the side of the module 200) beyond the first mount reference surface MS1. The convex portion 126 is formed in the circumferential direction so as to surround the connector portion 120. The claw portions 141c formed in the locking member 141 that is a turning member are located on the outer circumferential side beyond the convex portion 126 and extend inward at positions projected backward beyond the first mount reference surface MS1. That is, a part of claw portions 141c are at the same position as that of the first mount reference surface MS1 in the radial direction that perpendicularly intersects the optical axis when viewed from the optical axis direction. The part of the claw portions 141c are at a position at which the part overlaps the first mount reference surface MS1 in a direction parallel to the optical axis. Therefore, it is possible to prevent water and foreign matter from entering between the claw portions that fasten the device main body 100 and the module 200 and to prevent loosening of the engagement relationship between the claw portions.

When the module 200 is attached to the device main body 100, the claw portions 201a of the ring-shaped portion 201 and the claw portions 141c of the locking member 141 are engaged with each other. The claw portions 201a are located between the first and second mount reference surfaces and the claw portions 141c in a state in which the second mount reference surface MS2 is in contact with the first mount reference surface MS1. That is, the contact surface 201S is a contact surface with the claw portion 141c in the second mount portion M2.

An escape portion 226 for reducing interference with the convex portion 126 is formed on the inner peripheral side of the second mount portion MS2. The escape portion 226 is a portion recessed backward beyond the second mount reference surface MS2. The convex portion 126 enters the escape portion 226 in a state in which the module 200 has been attached to the device main body 100. Although the escape portion 226 may have a U shape to fit onto the convex portion 126 in the embodiment, any shape may be employed as long as the convex portion 126 can escape thereinto. For example, a configuration in which a part of the wall surface in a direction parallel to the optical axis (the wall surface in the inward direction in the module 200, for example) from the wall surfaces that form the escape portion 226 is not provided may be employed. In addition, a configuration in which a buffer member 227 that has a sealing function, for example, is arranged in a gap between the escape portion 226 and the convex portion 126 as illustrated in FIG. 20 may be employed. With this configuration, it is possible to more effectively curb invasion of water and foreign matter into the device as compared with a case in which the buffer member 227 is not provided.

In the embodiment, it is possible to enhance a water proofing effect and a foreign matter invasion prevention effect by hook-like engagement using the claw portions 141c that extend inward from the locking member 141 and the claw portions 201a that extend outward from the module 200. The claw portions 141c of the locking member 141 extend inward at a position projecting beyond the first mound reference surface MS1, at least a part thereof is located in the same radial direction as that of the first mount reference surface MS1, and the first and the second mount reference surfaces are brought into contact with each other. Further, it is possible to more reliably prevent invasion of water and foreign matter and to protect the connector portion 120 of the device main body 100 and the connector portion 210 of the module 200 by forming the convex portion 126 inside beyond the first mount reference surface MS1. Note that although the connector portions that establish electrical connection between the devices has been exemplified in the embodiment, the embodiment is not limited thereto. The embodiment may be applied to an electronic device that has various connection members that perform thermal connection and the like.

Referring to FIGS. 10 to 17, 21, and 22, an engagement relationship between the claw portions 141c of the locking member 141 and the claw portion 201a of the module 200 and a measure for preventing backlash therebetween will be described. FIG. 21A illustrates a state in which the claw portions 141c of the locking member 141 and the claw portions 201a of the ring-shaped portion 201 of the module 200 are engaged with each other when viewed in the optical axis direction of the imaging optical system. FIGS. 21B and 21C illustrate a positional relationship when the claw portions 141c are engaged with the claw portions 201a when viewed from the direction perpendicular to the optical axis direction of the imaging optical system. FIG. 21B illustrates a state in which the claw portions are engaged with each other, and FIG. 21C illustrates the claw portions 201a of the ring-shaped portion 201 of the module 200. FIGS. 22A and 22B illustrate the locking member 141 as an example. FIG. 22A is a back view of the device main body 100, and FIG. 22B is a perspective view illustrating the locking member 141. Although the claw portions 141c are formed at a substantially equal intervals at six locations in the ring-shaped portion 141b in another example illustrated in FIGS. 22A and 22B, the number of claw portions 141c can be arbitrarily set.

The ring-shaped portion 141b of the locking member 141 includes the plurality of claw portions 141c formed at a substantially equal interval in the circumferential direction. A first claw portion 141c1 (FIG. 14) from among the plurality of claw portions is formed on the side opposite to the locking operation portion 141a with the ring-shaped portion 141b interposed therebetween. In other words, the locking operation portion 141a and the first claw portion 141c1 are formed to extend from the ring-shaped portion 141b in a state in which parts thereof overlap with each other in the radial direction of the ring-shaped portion 141b. A third claw portion 141c3 is formed at a position at which the third claw portion 141c3 faces the first claw portion 141c in the ring-shaped portion 141b.

Figure 21B:
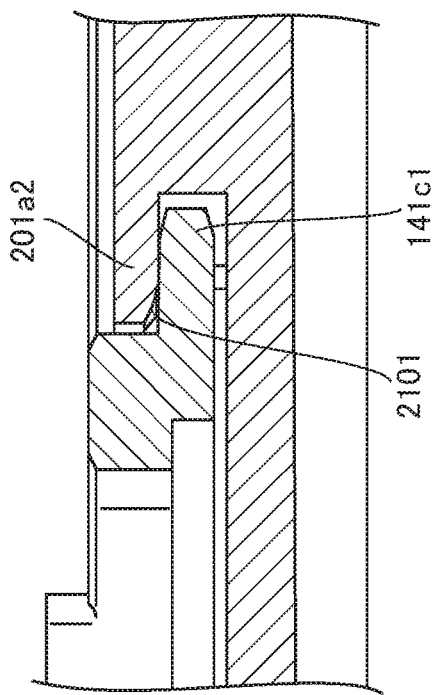
FIGS. 21A to 21C are diagrams for explaining an engagement relationship of claw portions in a radial direction and a thrust direction.
Figure 21C:
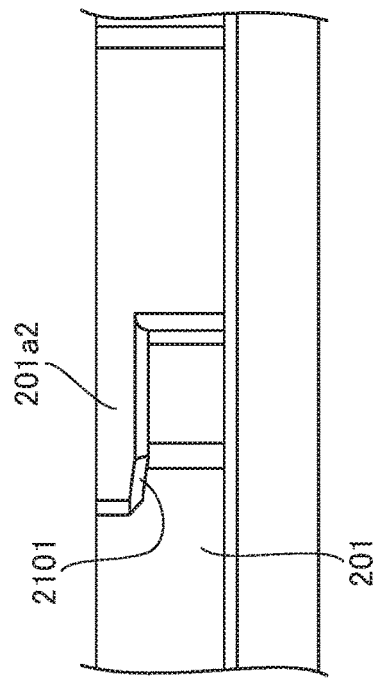
Figure 21A:
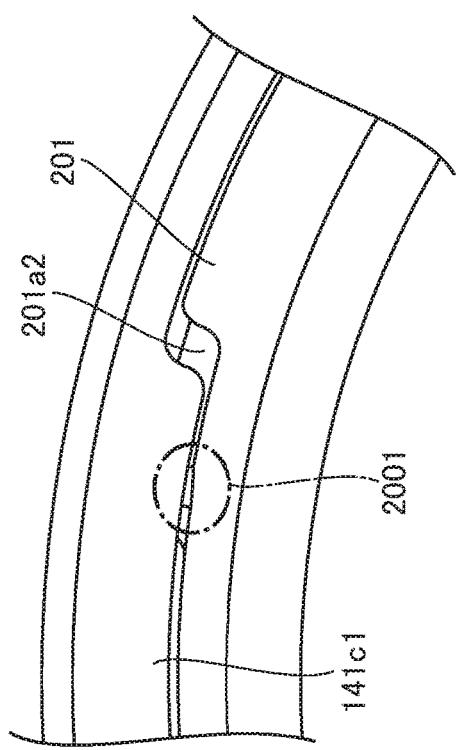
Figure 22B:
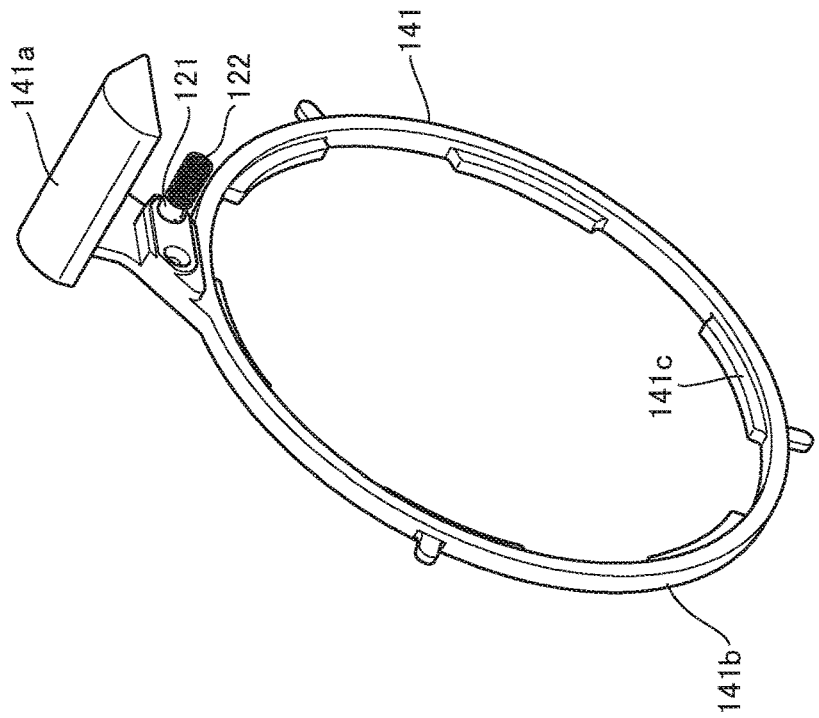
FIGS. 22A and 22B are diagrams illustrating a configuration example of the locking member.
Figure 22A:
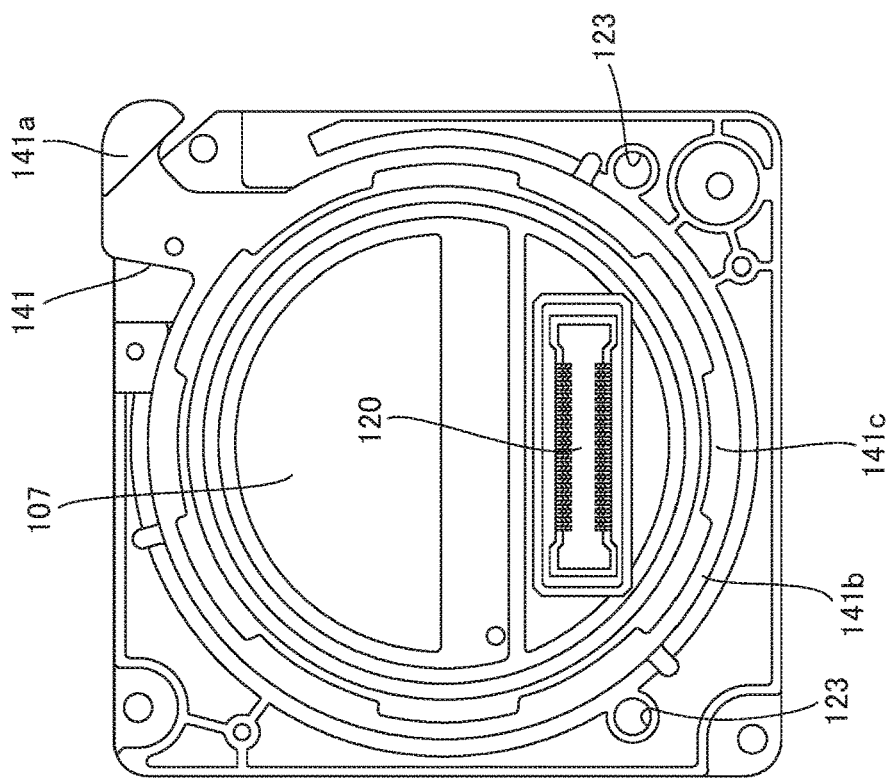

A second claw portion 201a2 (FIG. 11) that is engaged with a first claw portion 141c1 of the locking member 141 is formed, and a fourth claw portion 201a4 that is engaged with a third claw portion 141c3 of the locking member 141 is formed in the ring-shaped portion 201 of the module 200. As illustrated in the circular frame 2001 in FIG. 21A, the thickness of the second claw portion 201a2 in the direction perpendicular to the optical axis increases in a stepwise manner in a direction in which the locking member 141 moves from the unlocked position to the locked position when viewed from the optical axis direction of the imaging optical system. If the locking member 141 is turned toward the locked position, the first claw portion 141c1 moves over a tapered portion and moves to the position at which the first claw portion 141c1 is engaged with the second claw portion 201a2. That is, it is possible to reduce or eliminate the backlash in the radial direction at the time of the locking operation by forming the tapered portion in the circumferential direction (radial direction). In addition, an inclined portion 2101 with a thickness that varies in the optical axis direction of the imaging optical system is formed in the second claw portion 201a2 as illustrated in FIGS. 21(B-1) and (B-2). It is possible to reduce or eliminate backlash in the optical axis direction at the time of the locking operation by forming the tapered portion in the direction (thrust direction) parallel to the optical axis. Note that since other claw portions 201a also have a shape similar to that illustrated in FIG. 21A to 21C, detailed description thereof will be omitted.

A location with a highest likelihood that water, foreign matter, and the like will enter in a state in which the module 200 has been attached to the device main body 100 is the position of the locking operation portion 141a in the circumferential direction of the locking member 141. Therefore, it is effective to provide the first claw portions 141c in the vicinity of the locking operation portion 141a in terms of curbing of invasion of water or the like into the device main body 100. In this manner, the water proofing performance of the locking member 141 in the locked position is enhanced.

In the embodiment, it is possible to curb backlash between the device main body 100 and the module 200 by arranging the plurality of claw portions at an equal interval in the circumferential direction. In addition, it is possible to disperse a force (shear force) applied to the claw portions when the user tries to pull the module 200 away from the device main body 100 and to thereby avoid excessive force acting on the claw portions.

In addition, the second claw portion 201a2 and the fourth claw portion 201a4 (FIG. 11) have different maximum thicknesses in the direction perpendicular to the optical axis of the imaging optical system, and the fourth claw portion 201a4 has a greater maximum thickness than that of the second claw portion 201a2 in the embodiment. Backlash is easily removed by increasing the thickness of one of two claw portions that face each other in the radial direction. In addition, it is possible to minimize the gap between the device main body 100 and the module 200 at the formation position of the locking operation portion 141a that can be an entry route for water or the like, which is advantageous as a measure for drip proofing and a measure for dust proofing.

Figure 23:
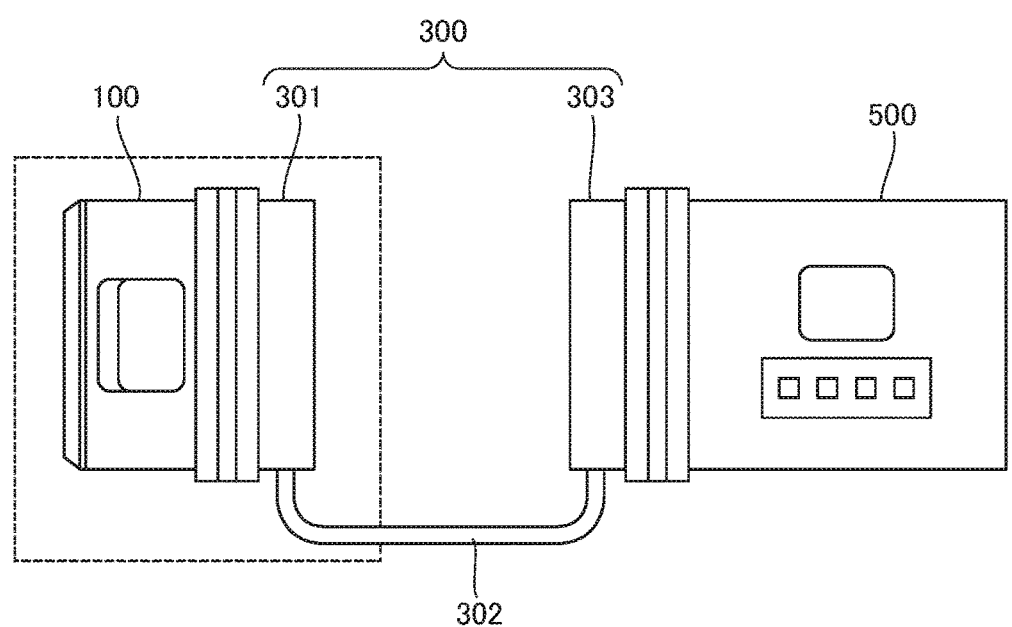
FIG. 23 is a schematic view illustrating, as an example, a form of use of the device main body and the module.
Figure 24:
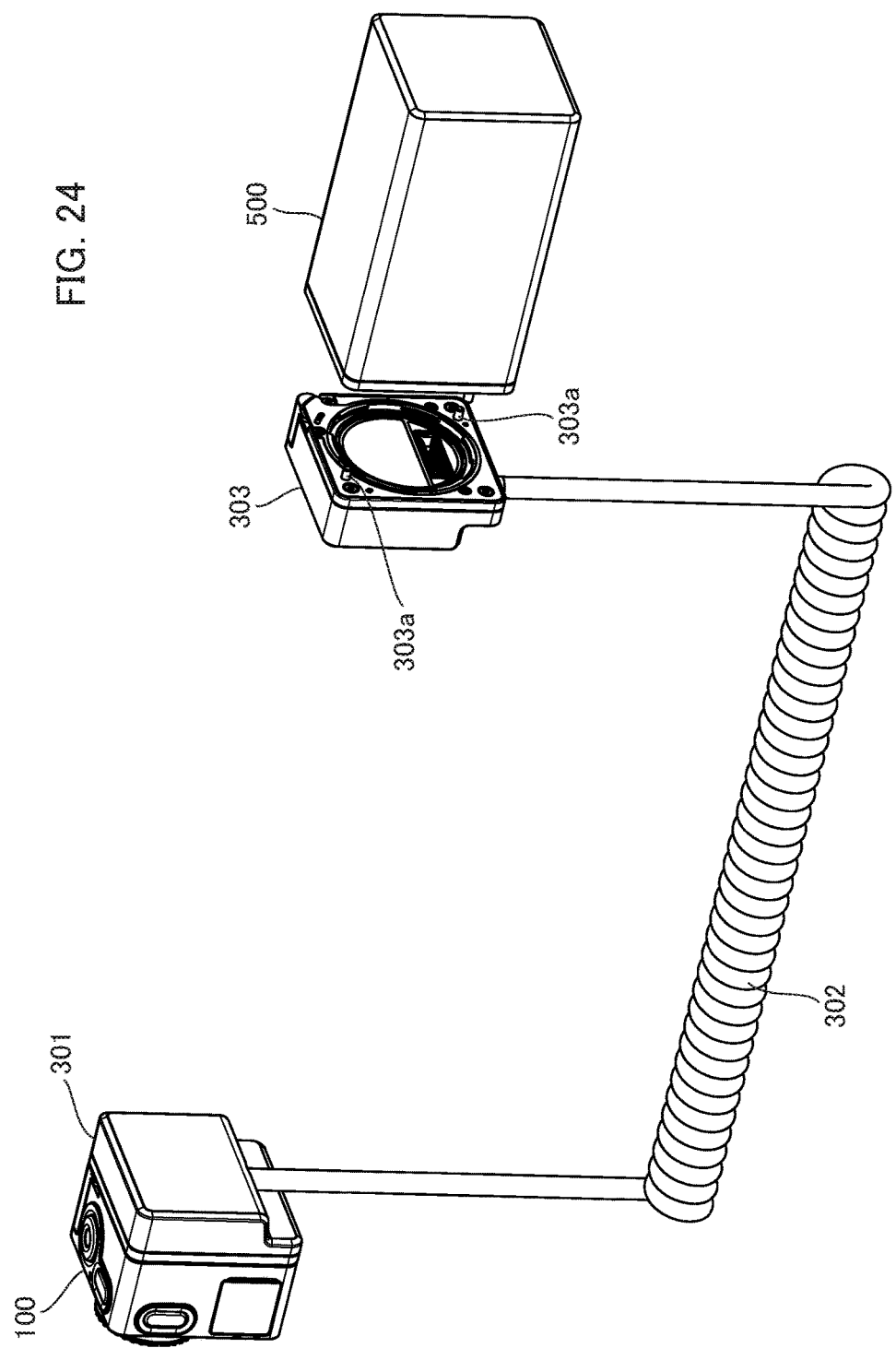
FIG. 24 is a perspective view illustrating a specific example in FIG. 23 from a back face side.
Figure 25:
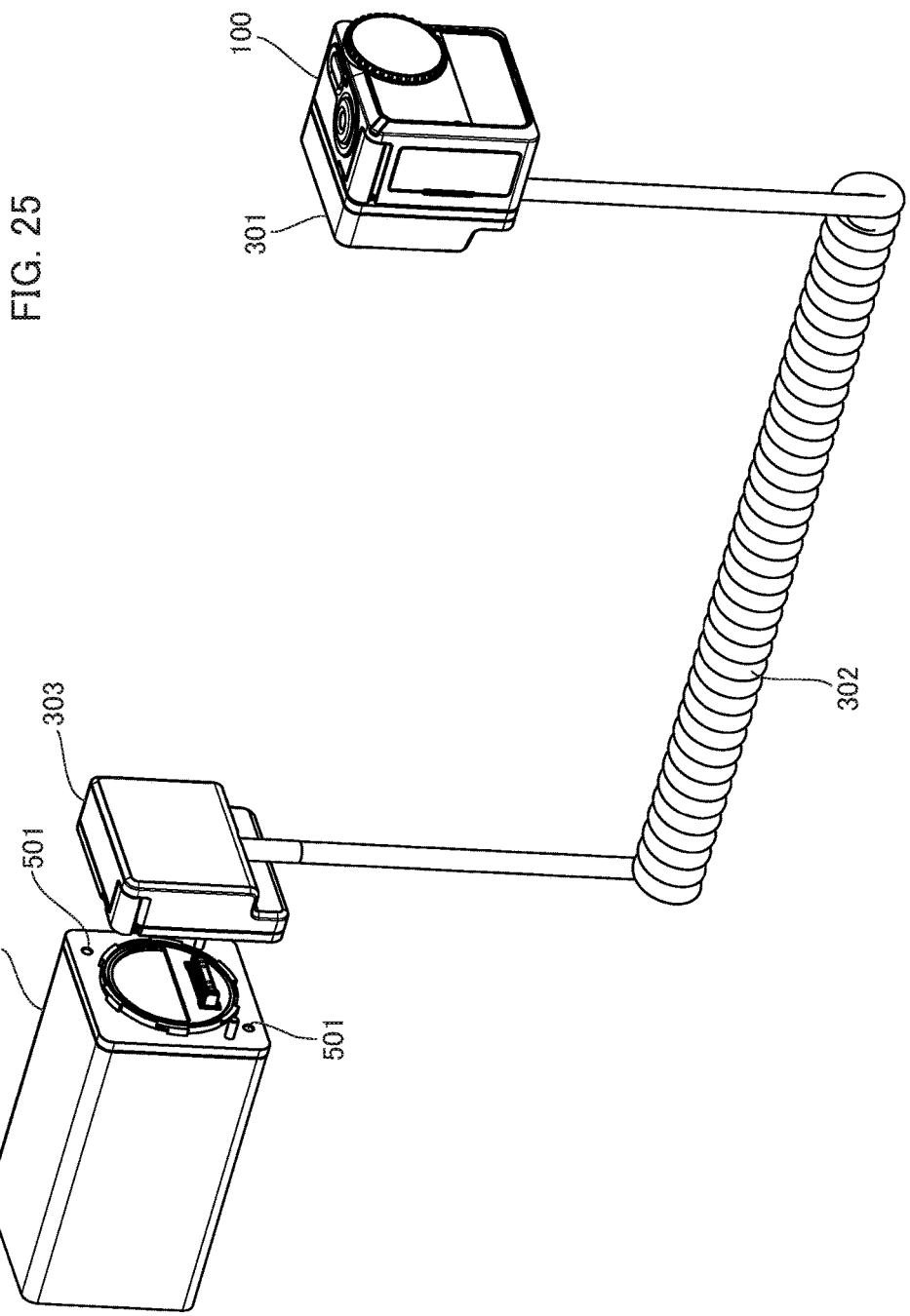
FIG. 25 is a perspective view illustrating the specific example in FIG. 23 from a front surface side.

FIG. 23 is a diagram illustrating an example in which an extension module 300 is connected and used for a power source module attached to the device main body 100. The extension module 300 includes a first interface portion 301, a cable 302, and a second interface portion 303. For example, it is possible to extend the operation time of the device by extending the device main body 100 and a power source module 500 with a larger power capacity than that of the aforementioned module 200 with the extension module 300. Since such a use form is available, convenience for the user is improved. FIGS. 24 and 25 illustrate specific examples.

A plurality of concave portions 501 (FIG. 25) are provided in a surface in contact with the second interface portion 303 in the power source module 500. A plurality of convex portions 303a (FIG. 24) are provided to extend at positions that respectively correspond to the plurality of concave portions 510 in the second interface portion 303 in a connection state between the power source module 500 and the second interface portion 303. With this configuration, it is possible to prevent connection between the same types of modules, for example, and to thereby prevent the modules, for which connection is not allowed, from being coupled to each other.

Figure 26:
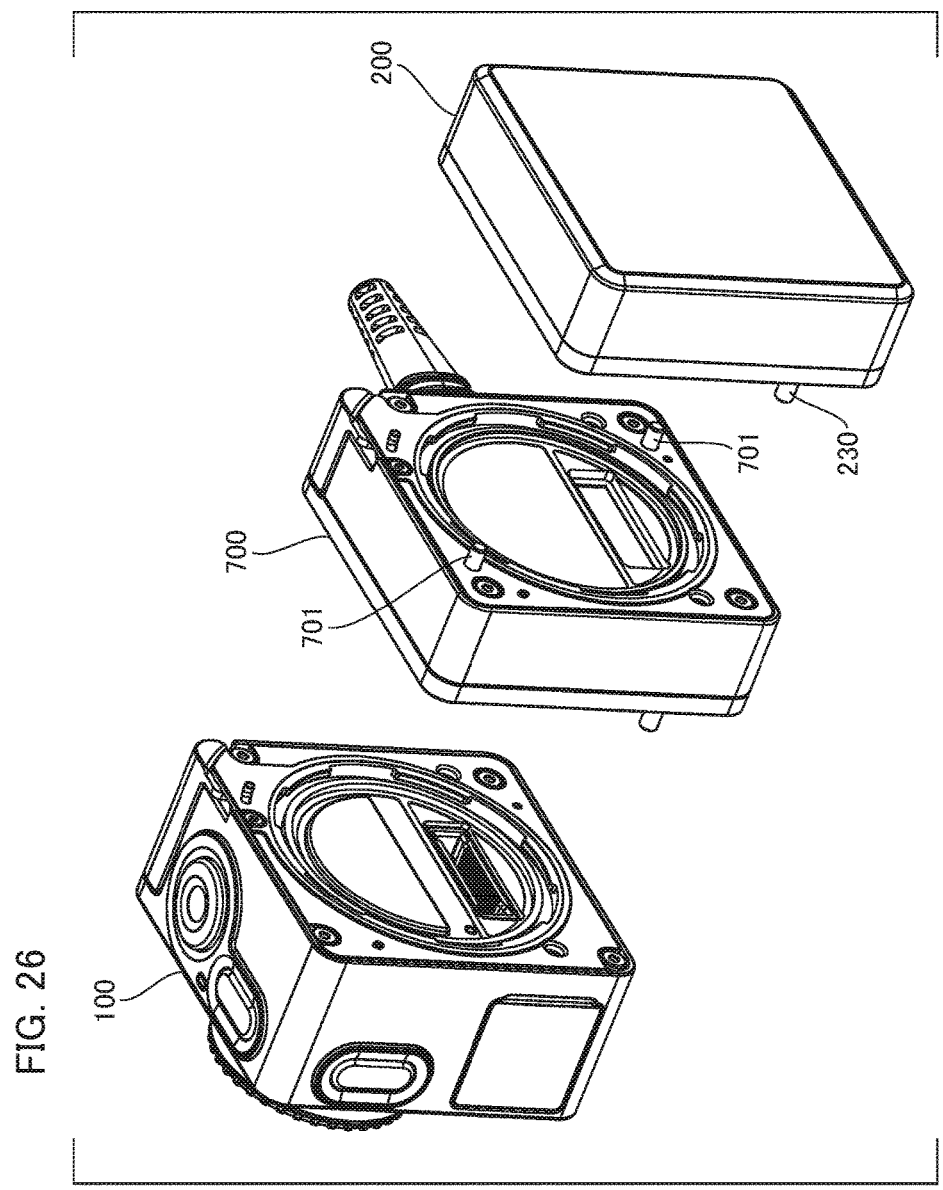
FIG. 26 is a perspective view illustrating, as another example, a form of use of the device main body and the module.
Figure 27:
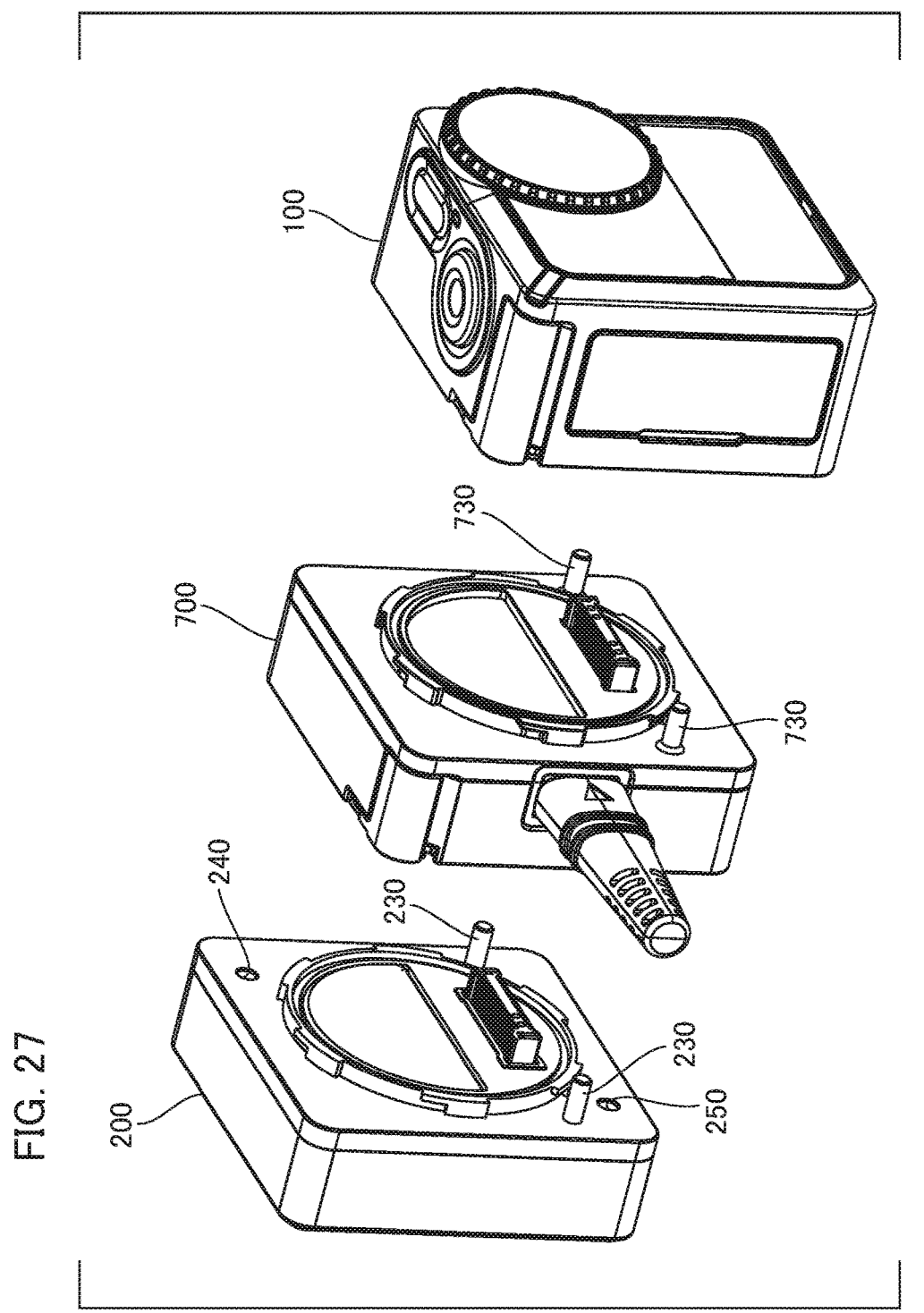
FIG. 27 is a perspective view illustrating, from the front surface side, the device main body and the module in FIG. 26.

FIGS. 26 and 27 are diagrams illustrating, as an example, a relay module 700 that is interposed between the device main body 100 and the power source module 200. A plurality of convex portions 701 (FIG. 26) are formed in the back surface portion of the relay module 700. The concave portions 240 and 250 (FIG. 27) are formed at positions that respectively correspond to a plurality of convex portions 701 in the power source module 200 in a connection state between the relay module 700 and the power source module 200. With this configuration, it is possible to prevent the modules, for which connection is not allowed, from being coupled to each other. Note that although the configuration in which a heat releasing member such as the aforementioned heat releasing member 107 of the device main body 100 is not provided at the interface portion of each module has been described with reference to FIGS. 23 to 27, a configuration in which the heat releasing member is provided may be employed. For example, a configuration in which a contact surface of the relay module 700 with the module 200 includes a heat releasing member that projects to correspond to the concave portion 206 of the module 200 in a manner similar to the heat releasing member 107 of the device main body 100 may be employed.

Fifth Embodiment

Next, a fifth embodiment of the present invention will be described. Only differences between this embodiment and the fourth embodiment will be described, and detailed description of components similar to those in the fourth embodiment will be omitted by using the reference numerals that have already been used. For attachment of the module 200 to the device main body 100, attachment and detachment based on a bayonet scheme are possible by the locking member being turned.

Figure 28:
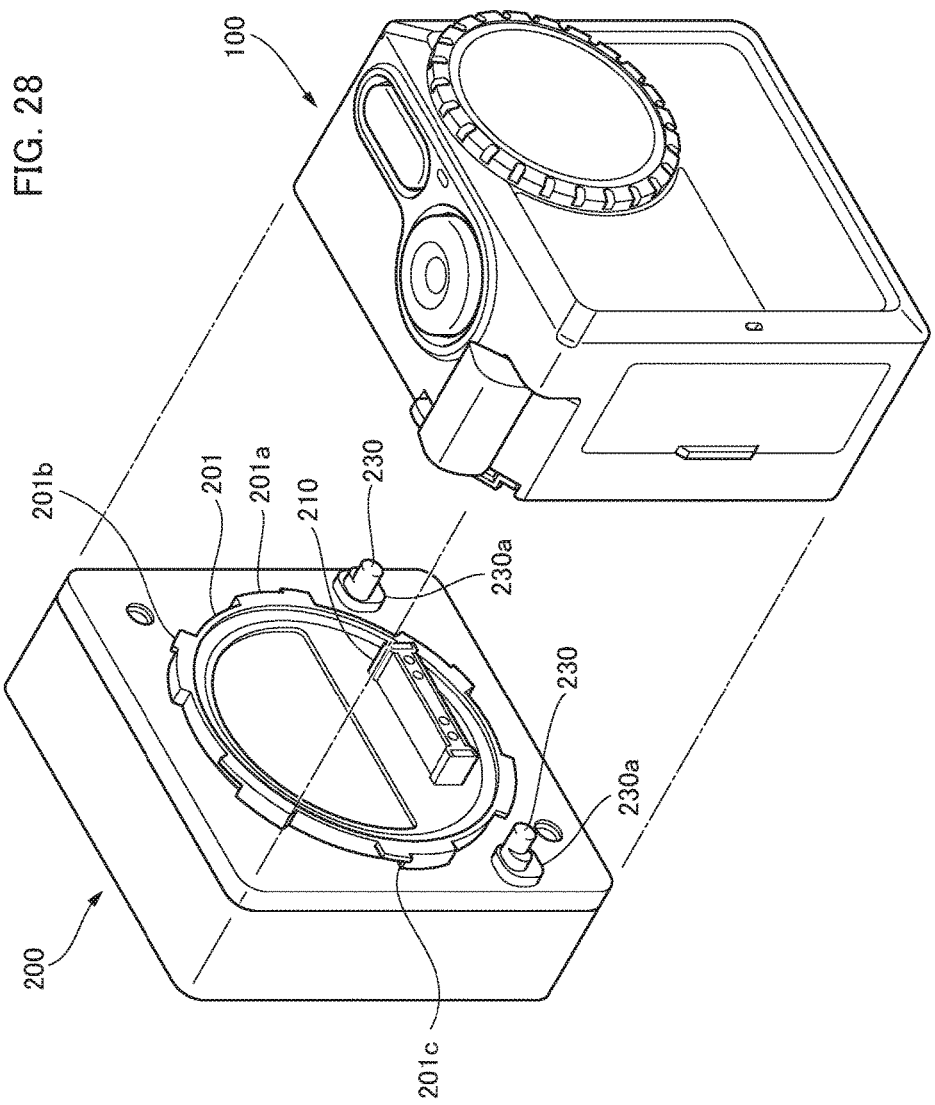
FIG. 28 is a perspective view illustrating, from the front face side, a module removed from a device main body according to a fifth embodiment.

FIG. 28 is a perspective view in a case in which a state of the module 200 removed from the device main body is viewed from the front face side. The device main body 100 is a camera module, and the module 200 is a power source module that has a battery.

The module 200 includes a case body that can be connected to the device main body 100 by bayonet coupling. The module 200 has the ring-shaped portion 201 at a front surface side for connection to the device main body 100. The plurality of convex portions 201a are formed in the ring-shaped portion 201 in a circumferential direction in a manner similar to that in the aforementioned module 200 according to the fourth embodiment, and a total of six convex portions 201a are formed at substantially equal intervals in the circumferential direction in the embodiment. Claw portions 201b are formed so as to further extend from the convex portions 201a at four convex portions 201a beyond the convex portion 201a, and the amount of projection of the module 200 in the radial direction from the center is greater at the claw portions 201b than at the convex portions 201a. The convex portions 201a have stepped portions in a direction parallel to the optical axis (a direction parallel to a projection direction of the engagement convex portions 230 of the module 200) when the module 200 is connected to the device main body 100. Groove portions 201c are formed by the stepped portions. The groove portions 201c are formed on the back face side at positions at which the claw portions 201b are formed to extend therefrom, for example, in the aforementioned direction parallel to the optical axis. In other words, the claw portions 201b and the groove portions 201c overlap with each other in the optical axis direction. The groove portions 201c engage with a plurality of claw portions (see FIG. 30: 141c) formed at the locking member 141 on the side of the device main body 100.

In the module 200 according to the embodiment, the amount of fitting between the claw portions 201b of the module 200 and the locking member 141, which will be described later, of the device main body 100 in the radial direction is increased by providing the claw portions 201b that project in the radial direction of the ring-shaped portion 201 as compared with the aforementioned fourth embodiment. With this configuration, the strength of impact when the device main body 100 with the module 200 attached thereto falls and the strength of the static pressure when a load is applied to the module 200 increase. Therefore, it is possible to prevent the connection between the devices from being released (falling off) in a state in which the connection between the device main body 100 and the module 200 is locked by the locking member 141.

The plurality of engagement convex portions 230 provided at the front surface portion of the module 200 are engagement pins that are respectively arranged on both right and left sides of the connector portion 210 outward from the ring-shaped portion 201. The engagement concave portions 123 (FIGS. 12 and 14) that respectively correspond to the plurality of engagement convex portions 230 are formed on the back face of the device main body 100, and the engagement convex portions 230 engage with the engagement concave portions 123 when the module 200 has been attached. The plurality of engagement convex portions 230 serves as a guide that provides guidance when the user attaches the module 200 to the device main body 100 and allows for safe and reliable connection of the connector portion 210. In addition, the engagement convex portions 230 also serve to protect the connector portion 210. Since the amount of projection of the engagement convex portions 230 is greater than the amount of projection of the connector portion 210 with reference to the front surface of the module 200, it is possible to avoid direct application of impact due to dropping of the module 200, for example, to the connector portion 210. Next, the diameter dimension of the engagement convex portions 230 according to the embodiment differs from that of a base portion toward a leading end (projecting) portion and is formed such that the dimension of a seating 230a becomes the largest in contrast to the aforementioned embodiment 4. The engagement concave portions 123 that have steps that can be fitted onto the engagement convex portions 230 are formed in the device main body 100. With this configuration, it is possible not only to stabilize the engagement state between the engagement convex portions 230 and the engagement concave portions 12 but also to improve the strength of the engagement convex portions 230.

Figure 29:
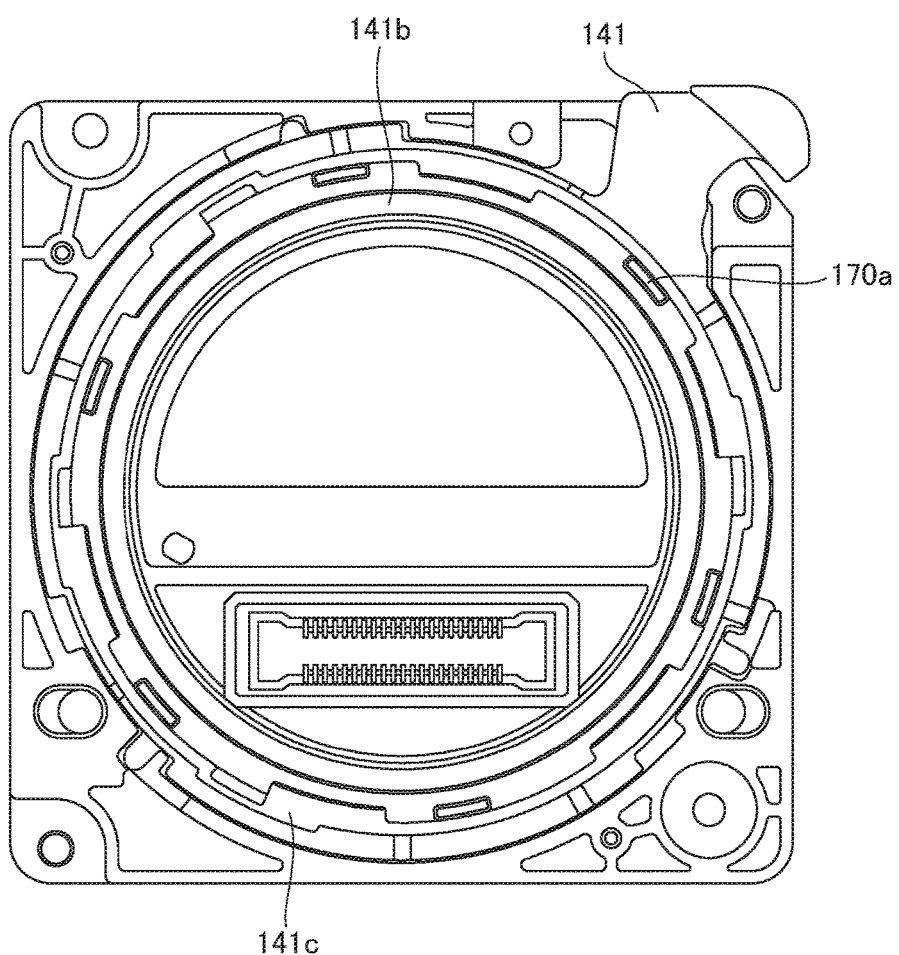
FIG. 29 is a back view of the device main body according to the fifth embodiment.
Figure 30:
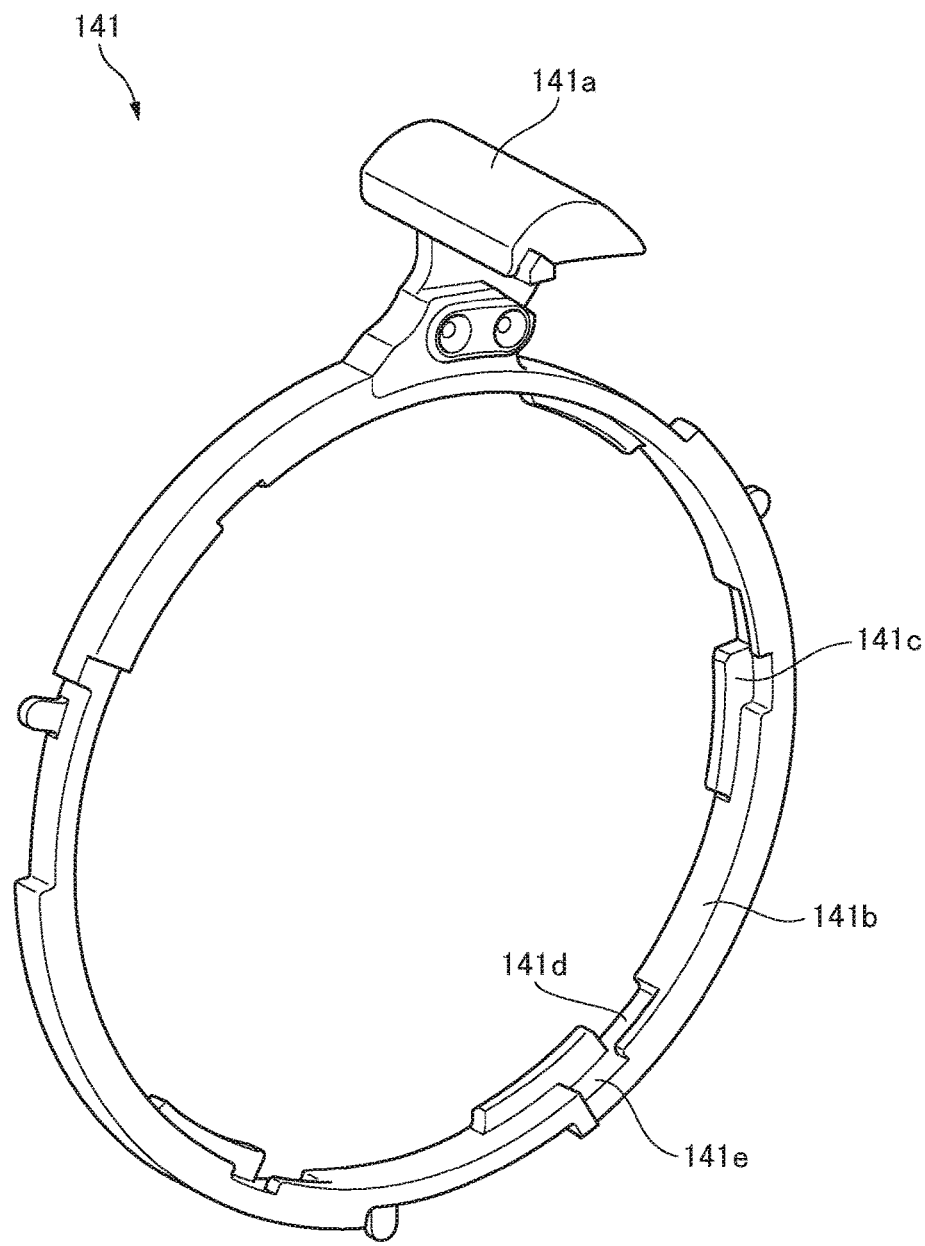
FIG. 30 is a perspective view of a locking member according to the fifth embodiment.

FIG. 29 is a back view of the device main body 100 according to the embodiment. In addition, FIG. 30 is a perspective view for explaining the locking member 141 in the device main body 100 according to the embodiment. As illustrated in FIGS. 29 and 30, six claw portions 141c are formed at substantially equal intervals in the circumferential direction of the ring-shaped portion 141b of the locking member 141. Note that the number of claw portions 141c is not limited to six and can be set to an arbitrary number. As compared with the aforementioned fourth embodiment, a groove portion 141d that is recessed in the outer radial direction beyond the inner circumferential surface of the ring-shaped portion 141b (a direction away from the center of the ring-shaped portion 141b) and a fitting portion 141e are formed in the locking member 141 according to this embodiment.

If the module 200 is attached to the device main body 100 in a state in which the locking member 141 is located at the locking released position, the plurality of claw portions 201b of the module 200 are located at (inserted into) the groove portion 141 of the locking member 141. The claw portions 201b of the module 200 are moved to the fitting portion 141e of the locking member 141 by operating the locking member 141 such that the locking member 141 is caused to move from this state to the locked position. This state will be described with reference to FIGS. 31 and 32.

Figure 31:
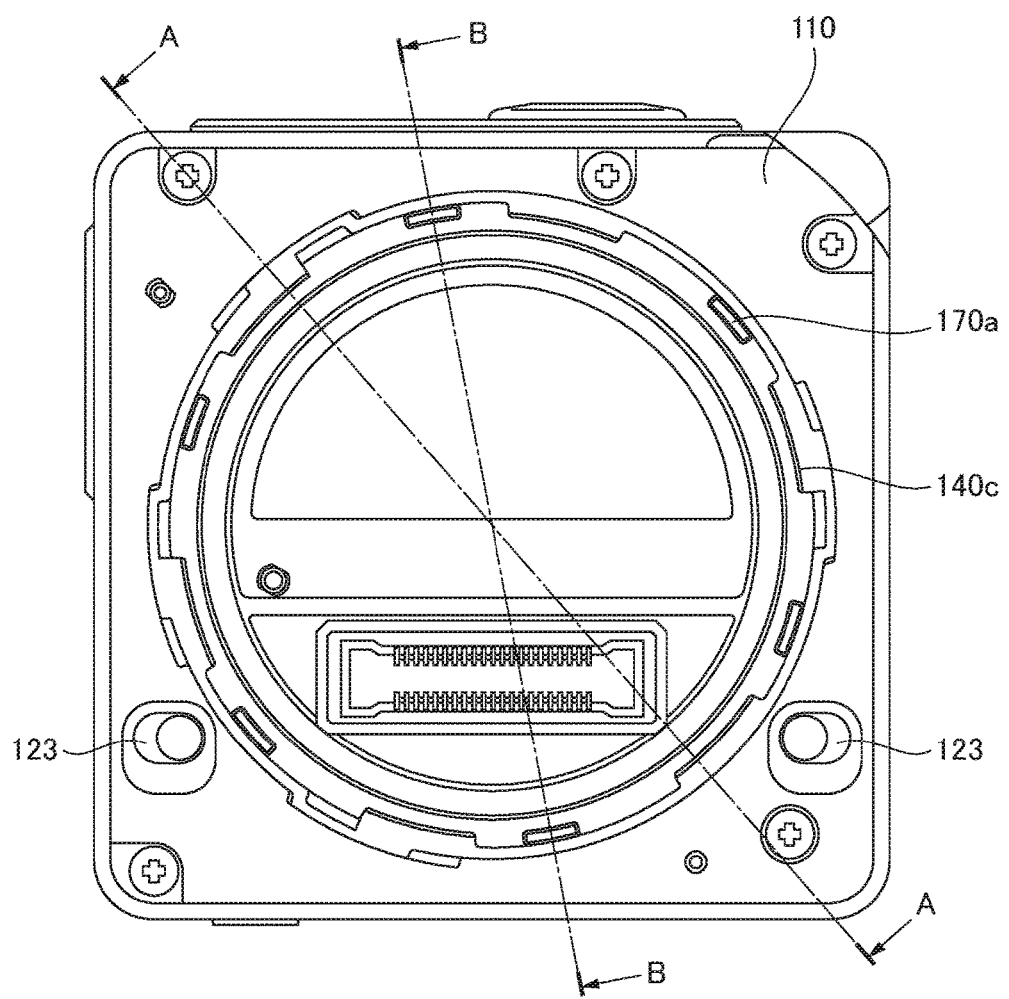
FIG. 31 is a diagram of the electronic device in a locked state, in which the device main body and the module are connected to each other, when viewed from the back face side according to the fifth embodiment.
Figure 32A:
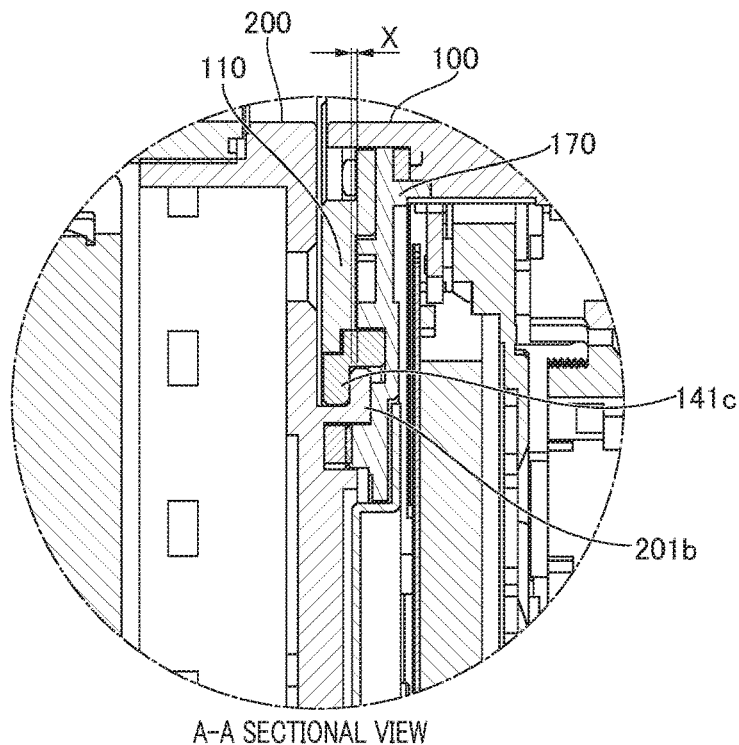
FIGS. 32A and 32B are sectional views taken along the A-A portion and the B-B portion illustrated in FIG. 31.
Figure 32B:
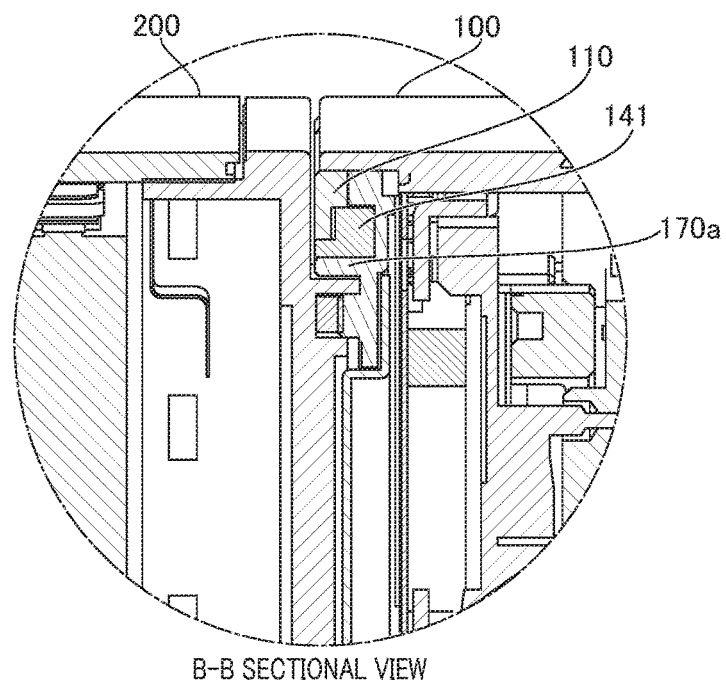

FIG. 31 is a diagram of the electronic device in a locked state in which the device main body 100 and the module 200 have been connected according to the embodiment when viewed from the back face side. FIG. 31 does not illustrate parts of the module 200 that are unnecessary for explanation. In addition, FIG. 32 is a partial sectional view. FIGS. 32(A) and 32(B) are a sectional view taken along the A-A portion and a sectional view taken along the B-B portion illustrated in FIG. 31, respectively.

As illustrated in FIG. 32(A), the module 200 is fixed to the device main body 100 by the claw portions 201b of the module 200 and the claw portions 141c of the device main body 100 becoming engaged with each other. At this time, the groove portion 141d and the fitting portion 141e are newly provided in the locking member 141 according to the embodiment in contrast to the aforementioned embodiment 4. This leads to an increase in the area in which the claw portions 201b (or the projecting portions 201a) are brought into contact with the claw portions 141c when the locking member 141 is located at the locked position. In addition, the contact area between the holding member 170 and the claw portions 201b also increases.

With this configuration, it is possible to prevent the connection between the devices from being released (falling off) in the locked state by the locking member 141 when the device main body 100 and the module 200 are connected to each other. Note that a gap X is provided such that the locking member 141 can rotate in a state in which the locking member 141 is interposed between the holding member 170 and the back face panel 110 in the embodiment as illustrated in FIG. 32(A). It is possible to reduce sliding friction between the locking member 141 and another member when the locking member 141 is rotated by providing the gap X.

In addition, a plurality of standing wall portions 170a that engage the inner circumferential surface of the ring-shaped portion 141b of the locking member 141 are formed to extend at substantially equal intervals in the circumferential direction in the holding member 170 as illustrated in FIG. 29. Note that although the case in which a total of six standing wall portions 170a are formed in the holding member 170 has been described in this embodiment, the number of standing wall portions 170a is not limited thereto and can be arbitrarily set.

As illustrated in FIG. 32(B), the standing wall portions 170a are formed to extend backward (on the side of the module 200) such that a predetermined pressure is applied to the inner circumferential surface side of the ring-shaped portion 141 from the inside of the ring-shaped portion 141b. Therefore, it is possible to suppress deformation of the ring-shaped portion 141b of the locking member 141 with the standing wall portions 170a and to prevent the locking member 141 from falling from the back face panel 110 even in a case in which excessive force is applied to the module 200.

According to the present invention, it is possible to provide a small electronic device that can be used with a second device reliably attached to a first device.

Note that the configuration of the present invention is not limited to the illustrated examples, and materials, shapes, dimensions, forms, numbers, arrangement locations, and the like can be appropriately changed without departing from the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An electronic device that can be used with a second device attached to a first device, the electronic device comprising:
   a locking member that is provided in the first device and fixes the second device to the first device when the second device is attached to the first device,
   wherein the locking member has a first engagement portion and an operation portion,
   wherein the second device has a second engagement portion that engages with the first engagement portion,
   wherein the operation portion is able to be operated between a locked position and a locking released position,
   wherein the first engagement portion and the second engagement portion engage with each other by the operation portion being operated to be in the locked position when the second device is attached to the first device,
   wherein the engagement between the first engagement portion and the second engagement portion is released by the operation portion being operated to be in the locking released position when the second device is attached to the first device, and
   wherein an amount of projection of the operation portion from a case body of the first device or the second device when the operation portion is located at the locking released position is greater than an amount of projection of the operation portion from the case body of the first device or the second device when the operation portion is located at the locked position.

2. The electronic device according to claim 1,
   wherein the first engagement portion has a plurality of first claw portions that are formed in a ring-shaped portion of the locking member,
   wherein the second engagement portion has a plurality of second claw portions that respectively engage with the plurality of first claw portions, and
   wherein the locking member is turned between the locked position and the locking released position.

3. The electronic device according to claim 2, wherein the operation portion is arranged at a corner of a case body of the first device or the second device.

4. The electronic device according to claim 1,
   wherein the locking member includes the ring-shaped portion that has the first engagement portion, and
   wherein the operation portion is integrally formed with the ring-shaped portion.

5. The electronic device according to claim 4, comprising an electric connection terminal provided inside the ring-shaped portion.

6. The electronic device according to claim 4,
   wherein the first or second device includes a heat releasing member,
   wherein a stretchable heat conductive member is provided inside the ring-shaped portion, and
   wherein the heat conductive member is pressure welded to the heat releasing member when the second device is attached to the first device.

7. The electronic device according to claim 1,
   wherein the locking member includes the ring-shaped portion that has the first engagement portion, and
   wherein in a case in which the operation portion is operated, the operation portion transmits operation force to the ring-shaped portion.

8. The electronic device according to claim 7,
   wherein the operation portion has a first teeth portion, and
   wherein the ring-shaped portion has a second teeth portion that meshes with the first teeth portion.

9. The electronic device according to claim 1, wherein an elastic member that biases the locking member in a direction from the locking released position toward the locked position is provided.

10. The electronic device according to claim 1, wherein the first device includes an imaging portion.

11. An electronic device that has an imaging portion that is exposed to a front surface and a first connector portion that is provided on a back face on an opposite side to the front surface, the electronic device being able to be connected to a module device that includes a second connector portion that is able to be electrically connected to the first connector portion, the electronic device comprising:
   a locking member that is connected to the module device by bayonet coupling; and
   a locking operation portion that is formed to extend from the locking member and projects from an external form of the electronic device at a locking released position of the locking member at which locking with the module device is released,
   wherein first to third surfaces of a case body of the electronic device are surfaces different from a front surface and a back surface of the electronic device,
   wherein the imaging portion is disposed in the vicinity of the first surface in the front surface of the electronic device, and wherein the locking operation portion is disposed in the vicinity of the third surface that is not adjacent to at least one of the first surface and the second surface.

12. The electronic device according to claim 11,
wherein the third surface is a surface that is not adjacent to the second surface, and
wherein the locking operation portion is disposed in the vicinity of the first surface and the third surface.

13. The electronic device according to claim 12, further comprising:
a first operation member that outputs an operation signal in response to a user's operation,
wherein the locking member moves between a locked position in which locking is established in a state in which the electronic device and the module device are connected and the locking released position,
wherein the first operation member is disposed in the first surface, and
wherein an amount of projection of the locking operation portion from the external form of the electronic device is equal to or less than an amount of projection of the first operation member at the locked position and is greater than the amount of projection of the first operation member at the locking released position.

14. The electronic device according to claim 13, wherein the locking operation unit is located at a position at which the locking operation portion overlaps with the first operation member at the locking released position in a case in which the electronic device is viewed from the side of the first surface.

15. The electronic device according to claim 13, further comprising:
a second operation member that is different from the first operation member,
wherein the first operation member is a member that is used for providing an instruction for imaging an object, and
wherein the second operation member is a member that outputs an operation signal that is different from that of the first operation member and is disposed at a position that is closer to an optical axis of the imaging portion than the first operation member is in the first surface.

16. The electronic device according to claim 11,
wherein the locking member includes a plurality of claw portions that are disposed in a circumferential direction in the ring-shaped portion, and
wherein a first claw portion in the plurality of claw portions are formed on an opposite side to the operation portion of the locking member with the ring-shaped portion interposed therebetween.

17. An electronic device that is able to be connected, through bayonet coupling, to a camera module that is the electronic device according to claim 16, the electronic device comprising:
a second claw portion that engages the first claw portion,
wherein a thickness of the second claw portion in a direction perpendicular to an optical axis of an imaging optical system of the camera module increases in a stepwise manner in a direction in which the locking member moves from a locking released position, at which locking is released, to a locked position, at which the electronic device is locked.

18. The electronic device according to claim 17, wherein the second claw portion has an inclined portion with a varying thickness in the optical axis direction of the imaging optical system of the camera module.

19. The electronic device according to claim 18,
wherein in a state in which the electronic device is connected to the camera module, the second claw portion has a projecting portion that is formed to extend in a radial direction perpendicular to the optical axis direction as compared with the other part of the second claw portion and a first groove portion to which the first claw portion of the camera module is fitted in the optical axis direction, and
wherein the projecting portion overlaps with the first groove portion in the optical axis direction.

20. The electronic device according to claim 16,
wherein the plurality of claw portions are disposed at equal intervals in the ring-shaped portion, and
wherein a third claw portion in the plurality of claw portions is formed at a position at which the third claw portion faces the first claw portion in the ring-shaped portion.

21. An electronic device that is able to be connected, through bayonet coupling, to a camera module that is the electronic device according to claim 20, the electronic device comprising:
a second claw portion that engages with the first claw portion and a fourth claw portion that engages with the third claw portion,
wherein a maximum thickness of the fourth claw portion in a direction perpendicular to the optical axis of the imaging optical system of the camera module is greater than a maximum thickness of the second claw portion in the direction perpendicular to the optical axis of the imaging optical system.

22. An electronic device that is able to be attached, through bayonet coupling, to a camera module that includes a heat releasing member that is provided inside a first mount portion that has a first mounting reference surface formed in a circumferential direction to extend in a first direction from the first mounting reference surface and a claw portion that projects beyond the first mounting reference surface in the first direction, the electronic device comprising, in a state in which the electronic device is attached to the camera module in a second direction that is opposite to the first direction:
a second mount portion that has a contact surface that is able to engage with the claw portion and a second mounting reference surface that is formed in a circumferential direction so as to face the first mounting reference surface; and
a concave portion that reduces interference with the heat releasing member by being formed inside the second mount portion and in the first direction beyond the second mounting reference surface.

23. An electronic device that is able to be attached, through bayonet coupling by turning of a turning member, to a camera module that includes a first connector portion, a first mount portion that has a first mounting reference surface that is formed in a circumferential direction, a convex portion that is formed in the circumferential direction to protrude inside the first mounting reference surface and in a first direction beyond the first mounting reference surface and surround the first connector portion, and the turning member that has a first claw portion that extends inward at a position that projects in the first direction beyond the first mounting reference surface, the electronic device comprising:
a second mount portion that has a second claw portion that extends in a second direction that is opposite to the first direction and is able to engage with the first claw portion and a second mounting reference surface that is formed in a circumferential direction so as to face the first mounting reference surface;

a second connector portion that is able to engage with the first connector portion; and an escape portion that reduces interference with the convex portion by being recessed in the first direction beyond the second mounting reference surface.

24. The electronic device according to claim 23, wherein in a state in which the electronic device is attached to the camera module in the second direction, the first claw portion and the second claw portion engage with each other, and the first mounting reference surface and the second mounting reference surface are brought into contact with each other, thereby causing the convex portion to enter the escape portion.

25. The electronic device according to claim 24, wherein the second claw portion is located between a portion, which faces the first mounting reference surface, of the first claw portion and the first mounting reference surface.

26. An electronic device that is able to be attached, through bayonet coupling, to a camera module that includes a heat releasing member that is provided to project inside a first mount portion that has a first mounting reference surface that is formed in a circumferential direction and in a first direction beyond the first mounting reference surface and a first connector portion that is disposed on a side below the heat releasing member in a first state, the electronic device comprising:

a second connector portion that is able to be electrically connected to the first connector portion; and a first concave portion that reduces interference with the heat releasing member in a state in which the camera module is attached to the electronic device, wherein the second connector portion is disposed on a lower side than the first concave portion in the state in which the camera module is attached to the electronic device and in the first state.

27. The electronic device according to claim 26, further comprising:

a convex portion that engages with a second concave portion that is provided in the camera module, wherein the second connector portion is disposed inside a second mount portion that has a second mounting reference surface that is formed in a circumferential direction so as to face the first mounting reference portion, and wherein the convex portion is disposed outside the second mount portion and in the vicinity of the second connector portion.

28. The electronic device according to claim 27, wherein the electronic device is able to be locked in a state in which the electronic device is attached to the camera module by operating a locking operation portion that is provided in the camera module in the state in which the electronic device is attached to the camera module, and wherein the convex portion is disposed on an opposite side to a region in which the convex portion faces the locking operation portion in a contact surface of the electronic device in a state in which attachment of the electronic device to the camera module is locked with the second connector portion interposed therebetween.

29. The electronic device according to claim 27, wherein the convex portion projects beyond the second connector portion in a second direction which is opposite to the first direction.

* * * * *